United States Patent [19]
Tsuneta et al.

[11] Patent Number: 5,650,621
[45] Date of Patent: Jul. 22, 1997

[54] ELECTRON MICROSCOPE

[75] Inventors: Ruriko Tsuneta, Kokubunji; Hiroshi Kakibayashi, Nagareyama, both of Japan

[73] Assignee: Hitachi, Ltd., Tokyo, Japan

[21] Appl. No.: 534,019

[22] Filed: Sep. 26, 1995

Related U.S. Application Data

[63] Continuation-in-part of Ser. No. 262,540, Jun. 20, 1994, Pat. No. 5,453,617.

[30] Foreign Application Priority Data

Jun. 21, 1993 [JP] Japan .................. 5-148853

[51] Int. Cl.$^6$ .................................. H01J 37/26
[52] U.S. Cl. ........................................ 250/311
[58] Field of Search ........................ 250/311, 306, 250/307

[56] References Cited

U.S. PATENT DOCUMENTS

| | | | |
|---|---|---|---|
| 3,833,811 | 9/1974 | Koike et al. | 250/311 |
| 4,146,788 | 3/1979 | Mirkin et al. | 250/311 |
| 4,945,237 | 7/1990 | Shii et al. | 250/311 |
| 5,453,617 | 9/1995 | Tsuneta et al. | 250/311 |

FOREIGN PATENT DOCUMENTS

| | | |
|---|---|---|
| 62-26755 | 2/1987 | Japan . |
| 5-92949 | 12/1993 | Japan . |
| 5-92950 | 12/1993 | Japan . |

OTHER PUBLICATIONS

Japanese Journal of Applied Physics, vol. 26, No. 5, May 1987, Kakibayashi et al, pp. 770–771.
Japanese Journal of Applied Physics, vol. 30, No. 1A, Jan. 1991, Kakibayashi et al, pp. L52–L55.
Japanese Journal of Applied Physics, vol. 25, No. 11, Nov. 1986, pp. 1644–1649.
Japanese Journal of Applied Physics, vol. 30, No. 6A, Jun. 1991, pp. L959–L962.

*Primary Examiner*—Jack I. Berman
*Assistant Examiner*—Kiet T. Nguyen
*Attorney, Agent, or Firm*—Fay, Sharpe, Beall, Fagan, Minnich & McKee

[57] ABSTRACT

The composition change and strained structure in a hetero-interface or thin film of a multilayer thin film specimen are observed. When the composition change and strained structure are observed, comparison between a dark-field image and a bright-field image and comparison between two dark-field images are required. The position of an objective aperture disposed between the specimen and a detector is moved rapidly so that diffracted wave or transmitted wave corresponding to the dark-field image or bright-field image of a desired plane index is transmitted. As a result, the dark-field image or bright-field image of a desired plane index can be observed correspondingly to the position of the objective aperture.

8 Claims, 17 Drawing Sheets

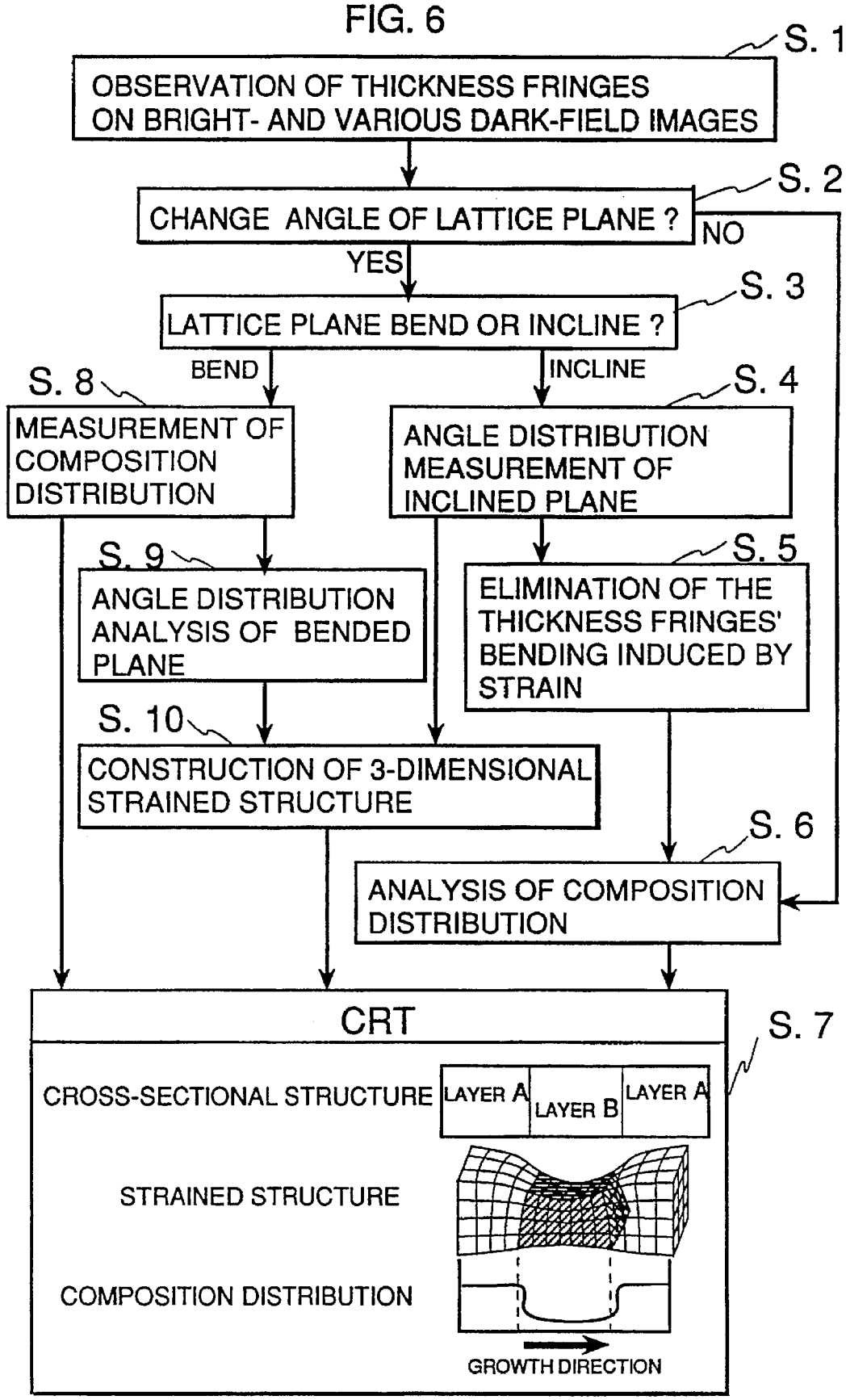

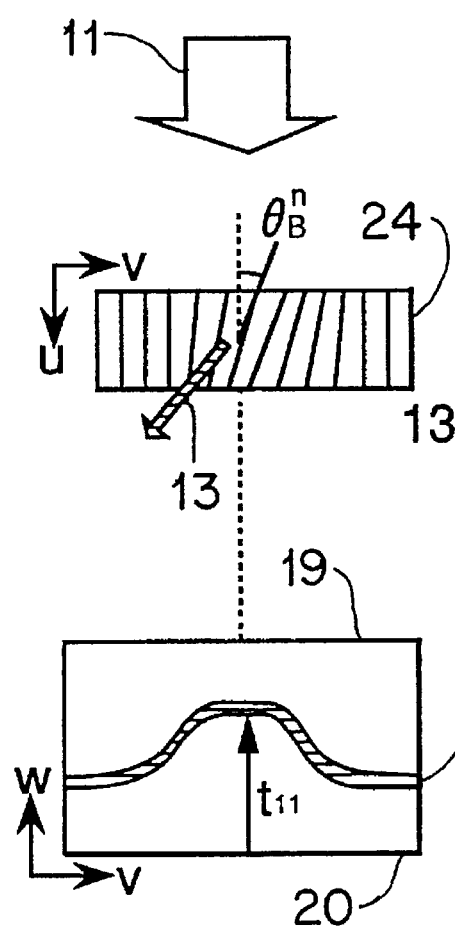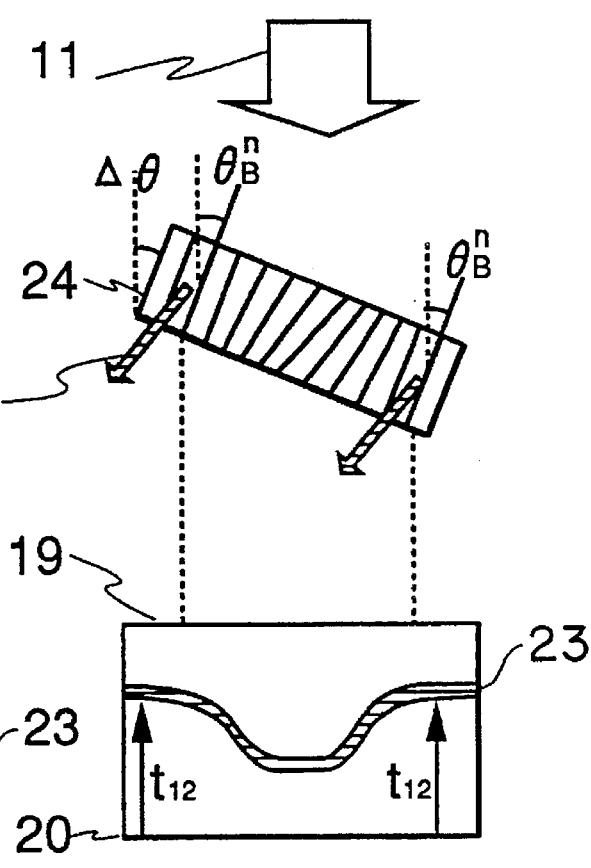

00n DARK FIELD IMAGE 00-n DARK FIELD IMAGE

FIG. 15 A
FIG. 15 B
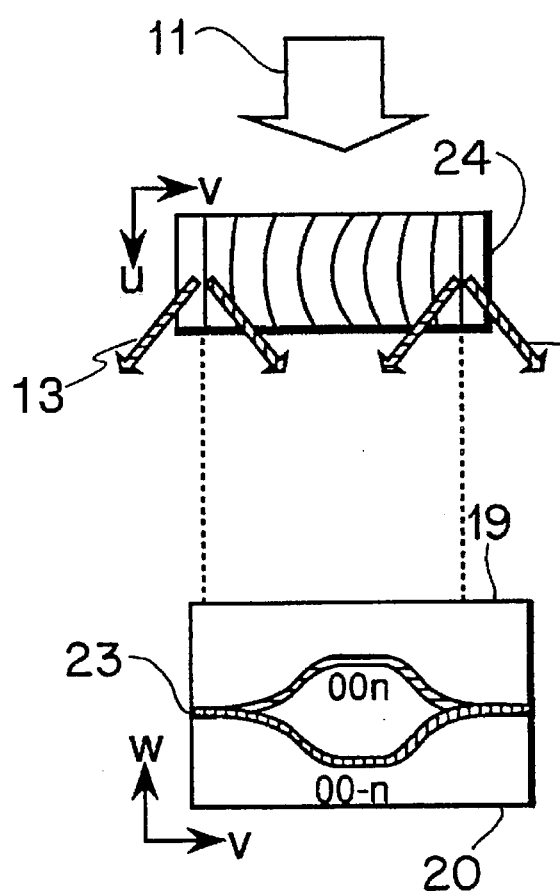
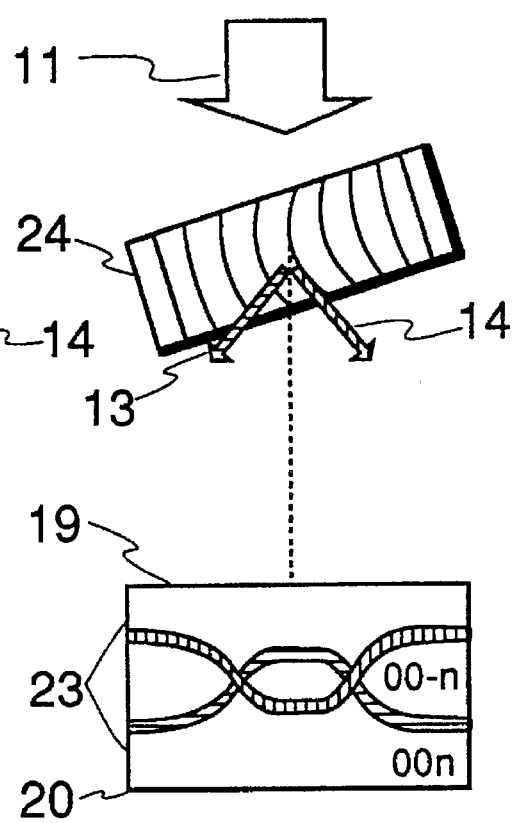

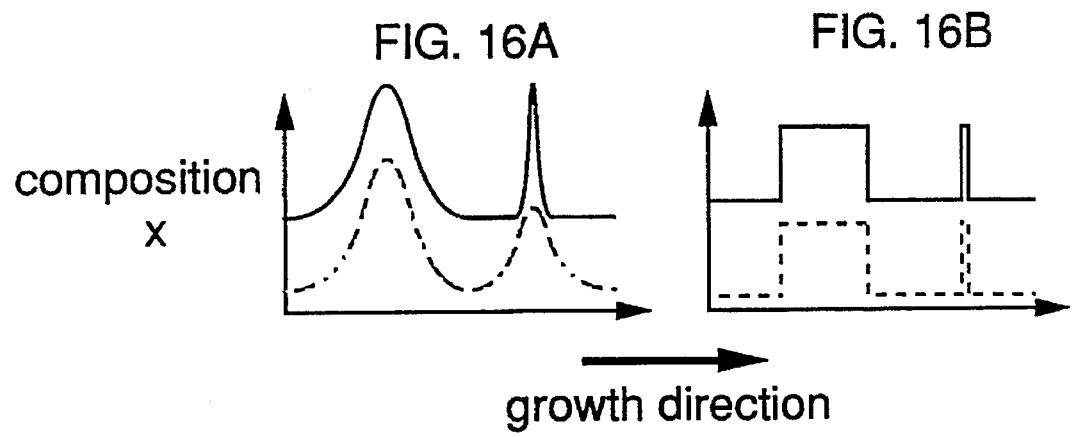
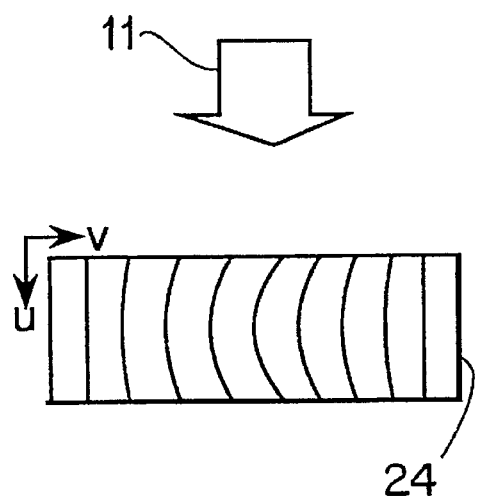
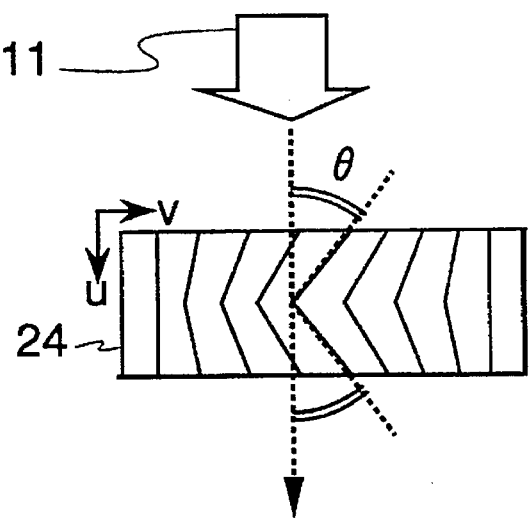

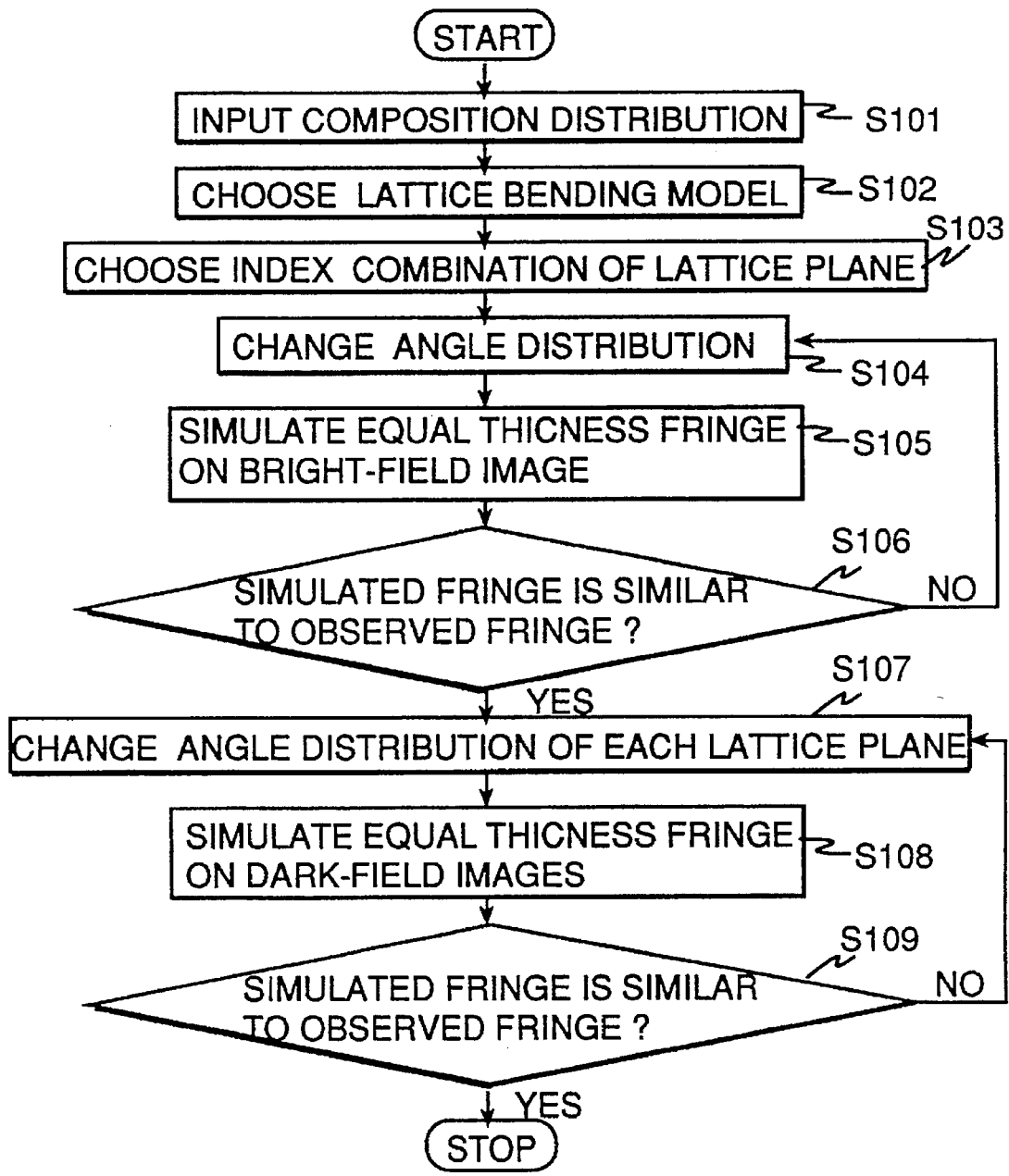

ELECTRON MICROSCOPE

CROSS-REFERENCE TO RELATED APPLICATION

The present application is a continuation-in-part of U.S. patent application Ser. No. 08/262,540 filed on Jun. 20, 1994, now U.S. Pat. No. 5,453,617. The contents of that application are incorporated herein by reference.

BACKGROUND OF THE INVENTION

The present invention relates to an electron microscope apparatus for composition and strain analysis and an observation method thereof for providing guides to process check, optimization, and device design by analyzing quantitatively composition and strained structure of corpuscles located in a heterointerface or a thin film of a device formed by crystalline growth, especially a device utilizing a strained superlattice such as a high mobility transistor or a super-high-speed semiconductor laser.

For evaluating the composition distribution and strained structure in a thin film or in the vicinity of a heterointerface of a strained superlattice device, there is needed a technique capable of measuring the composition and strained structure with a high depth resolution while keeping association with the cross-sectional structure of the device. In order to satisfy this need, several measuring methods using an electron microscope have heretofore been invented. For example, in "Method for quantitatively analyzing composition by using electron microscope" described in JP-A-62-26755, composition changes in a thin film or in the vicinity of a hetero-interface are measured by impinging an electron beam upon a specimen cleaved in a wedge form, obtaining a bright-field image formed by its transmitted wave, detecting an equal thickness fringe appearing on the image, and utilizing such a phenomenon that intensity distribution of the equal thickness fringe is changed according to composition. Furthermore, in a strain measuring method described in Japanese Journal of Applied Physics, Vol. 30, 1991, pp. L52–L55, strain distribution is measured as an amount of inclination of a lattice plane by using a bright-field image and such a phenomenon that intensity distribution of the equal thickness fringe is changed by a slight inclination of the lattice plane caused by lattice strain.

According to the above described composition distribution measuring method, composition distribution can be determined beforehand for an unstrained specimen on the basis of a change in intensity distribution of the equal thickness fringe. Whether there is bending or not in the lattice plane and its angle distribution can be determined, only in case where the structure factor is similar between thin films and the intensity distribution of the equal thickness fringe does not change even if the composition is changed. This method can be applied to only specimens placed under restricted conditions.

By using only the two conventional techniques mentioned above, it is impossible to measure separately the composition distribution and strain distribution in a general specimen in which the composition change and the lattice strain are mixed. Furthermore, in the above-described strain distribution measuring method, only a simple strain structure in which the tilting angle distribution of the lattice plane is constant with respect to the direction of incidence of an electron beam is considered as a strain structure. Accordingly, the above-described strain distribution measuring method cannot be adapted to analysis of a general strain structure in which the tilting angle distribution of the lattice plane changes with respect to the aforementioned direction.

Furthermore, in the above-described strain distribution measuring method, measurements are made with a bright-field image, and hence there can be obtained only information concerning the average of tilting angles of lattice planes having respective plane indexes. Accordingly, it is impossible to analyze the dependence of tilting (direction of tilting) of the lattice plane upon plane index or analyze 3-dimensional strained structure. Furthermore, in a bright-field image, a change of intensity distribution of the equal thickness fringe as a function of the inclination value of the lattice plane is determined by crystal composition. Therefore, it is difficult to improve the measurement sensitivity of the inclination angle of the lattice plane.

Furthermore, according to the above described conventional techniques, the observer measures, on a photograph, intensity distribution of an equal thickness fringe appearing on an electron microscope image of a wedge-shaped specimen, compares the intensity distribution with intensity distribution of a calculated image obtained by using the electron diffraction theory, and thus makes a quantitative analysis of composition or strain distribution. Therefore, a skilled observer is needed for image analysis. In addition, it is also difficult for persons other than the observer to understand the result of analysis.

SUMMARY OF THE INVENTION

It is an object of the present invention to provide an apparatus and a method in which even an unskilled person can analyze easily a specimen in which composition change and lattice strain are mixed or a specimen having a complex strain structure, by using dark-field in ages of various plane indexes while the specimen is tilted in various directions.

An electron microscope is provided with a special purpose implement having a spring plate to fix a wedge-shaped specimen, a specimen holder having a specimen cooling system for reducing specimen damage caused by electron illumination and a double tilt system controlled by a processor, an objective aperture capable of moving to positions of a desired diffracted wave and a transmitted wave at high speed, an electron beam detector capable of taking in an image in synchronism with movement of the objective aperture, and a processor for controlling the objective aperture and the electron beam detector so that bright-field image and a plurality of dark-field images may be observed by a single apparatus. The processor is provided with means for conducting image processing on an equal thickness fringe appearing on the electron microscope image.

A specimen is cleaved in a wedge form, fixed on the specimen holder, and subjected to electron illumination. By utilizing the position relation between the Kikuchi lines pattern and the diffraction spot on the diffraction pattern, the specimen is tilted by the tilt system so that the khl lattice plane in an unstrained region of a substrate or the like may become parallel to the electron beam. While keeping this tilt, an electron beam is impinged upon an observation subject, i.e., a crystal formed on the substrate. A diffraction spot having a plane index hkl and a diffraction spot having an opposite plane index -h-k-l are selected. By using the above described objective aperture and a control system of the electron beam detector, both a hkl dark-field image and a -h-k-l dark-field image are observed. If there is a difference between an equal thickness fringe on the hkl dark-field image and an equal thickness fringe on the -h-k-1 dark-field image, it can be decided that the angle of a (khl) lattice plane changes.

Then, a judgment is made as to whether the change of the angle of the lattice plane in a strained region is of a lattice plane tilting type in which the angle change is constant with respect to the direction of incidence of an electron beam or of a curve type in which the angle change has a distribution. When a specimen is tilted while a strength distribution of an equal thickness fringe on the hkl dark-field image is compared with a strength distribution of an equal thickness fringe on the -h-k-l dark-field image, the angle change is decided to be of a lattice plane tilting type in the case where the two are coincident in specimen tilting angle with each other or the angle change is decided to be of a curve type in the case where the two are not coincident in specimen tilting with each other.

Then, an observed region is divided into segments in the growth direction by using image processing where lattice planes are inclined, and the inclination angle of the lattice plane in each segment is measured. There are two methods for measuring the difference of the inclination angle of the lattice plane between a strained region and an unstrained region. According to one of the two methods, a measurement is made by tilting the specimen while comparing intensity distribution of the equal thickness fringe on the hkl dark-field image with intensity distribution of the equal thickness fringe on the -h-k-l dark-field image and detecting the inclination angle of the specimen when both have coincided with each other.

According to the other of the two methods, such a phenomenon that the intensity distribution of the equal thickness fringe on the khl dark-field image has a maximum if the (khl) lattice plane satisfies the Bragg condition with respect to an incident electron beam is used, and a measurement is made by detecting the inclination angle of the specimen when the intensity distribution of the equal thickness fringe on the hkl dark-field image has a maximum while tilting the specimen.

Then, by using the strain distribution measured according to the above described method, i.e., inclination angle distribution of the lattice plane, an equal thickness fringe without the influence of strain removed is reconstructed from the intensity distribution change of the equal thickness fringe on the bright-field image and the composition change is analyzed according to the conventional method. Furthermore, an analysis of composition change without the influence of strain can be made from the intensity distribution change of the equal thickness fringe of the dark-field image as well in the same way.

In the case where the angle change of the lattice plane is of a curve type, the quantities of curvature of lattice planes having respective plane indexes are estimated by comparison between observation images and simulation images of equal thickness fringes on dark-field and bright-field images having various plane indexes. To make simulation efficiently, firstly the composition distribution is measured by another composition distribution measuring method, secondly the quantity of curvature of a lattice plane is identified by a bright-field image, and finally the direction of curvature of the lattice plane is decided by a dark-field image.

Then, measurement results of the angle change of lattice planes having respective plane indexes and measurement results of the angle distribution thereof as obtained by the above-described analysis are integrated to construct a 3-dimensional strained structure.

Results of analysis thus obtained with respect to the composition distribution and strain distribution are displayed on a CRT as a 3-dimensional lattice model and a line profile so as to correspond to the cross-sectional structure of the specimen.

By using a spring plate instead of an adhesive to fix a specimen, degradation of vacuum in a specimen chamber can be prevented. Furthermore, since damage of the specimen caused by the incident electron beam can be decreased by providing a specimen cooling system in the specimen holder, it also becomes possible to observe a dark-field image of high order needing an increase of the amount of incidence electron illumination.

By providing means making it possible to observe both the dark-field image and bright-field image having different plane indexes by means of a single apparatus, it can be determined in a short time which plane index provides a highly sensitive, clear and optimum dark-field image or bright-field image for observing the composition and strain.

Shortening of the observation time is effective for reduction of damage of the specimen caused by electron illumination as well. Furthermore, since dark-field images and bright-field images of a plurality of plane indexes can be observed under the same specimen condition, information of the composition distribution and angle distribution of the lattice plane also increases.

By using, in analyzing the strained structure, equal thickness fringes on dark-field images of various plane indexes measured at various specimen tilting angles, it becomes possible to make the measurement of the lattice plane tilting angle distribution and the analysis of the composition distribution in a specimen having a mixture of a composition change and lattice strain and to make the analysis of the lattice plane tilting angle distribution in a complex strained structure, which has been impossible in the conventional technique.

Furthermore, by using dark-field images, the angle distributions of lattice planes in respective plane indexes can be estimated separately, so that it is possible to obtain 3-dimensional information of strain structure, which has been impossible in the conventional technique. Furthermore, if dark-field images of high order are used, the intensity of the electron beam of the diffracted wave becomes weak, but the change value of the intensity distribution of the equal thickness fringe with respect to the inclination angle of the lattice plane increases, resulting in an improved measurement sensitivity of the inclination angle distribution of the lattice plane.

Since the above described analysis process is conducted by using observation means for conducting image processing mounted on the processor attached to the microscope, a skilled observer is not needed unlike the conventional technique. Furthermore, since results of analysis of composition and strain are displayed on a CRT as a line profile and a 3-dimensional lattice model so as to correspond to the cross-sectional structure of the specimen, in which interface position of a layered structure and in which distribution, for example, the composition and strain have changed can be easily understood.

BRIEF DESCRIPTION OF THE DRAWINGS

These and other objects and technical advantages of the present invention will be readily apparent from the following description of the preferred exemplary embodiments of the invention in conjunction with the accompanying drawings, in which:

FIG. 6 is a flow chart showing an embodiment of an observation method according to the present invention;

FIGS. 10A and 10B are diagrams showing the change of distance of equal thickness fringe on the dark-field image when the specimen having the lattice plane partially inclined is tilted;

FIGS. 15A and 15B are diagrams showing the change of distance of equal thickness fringes on dark-field images of opposite signs when the specimen having a partially curved lattice plane is tilted;

FIG. 16A is a graph showing the continuous change of the composition in the vicinity of a heterointerface;

FIG. 16B is a graph showing the precipitous change of the composition;

FIG. 17A is a diagram showing the curves of lattice planes in a real specimen;

FIG. 17B is a diagram showing lattice planes obtained by simplifying the lattice planes of FIG. 17A for simulation analysis; and FIG. 18 is a flow chart for analyzing the quantities of curvature of lattice planes by using equal thickness fringes on bright-field images and dark-field images.

DESCRIPTION OF THE PREFERRED EMBODIMENTS

Figure 1:
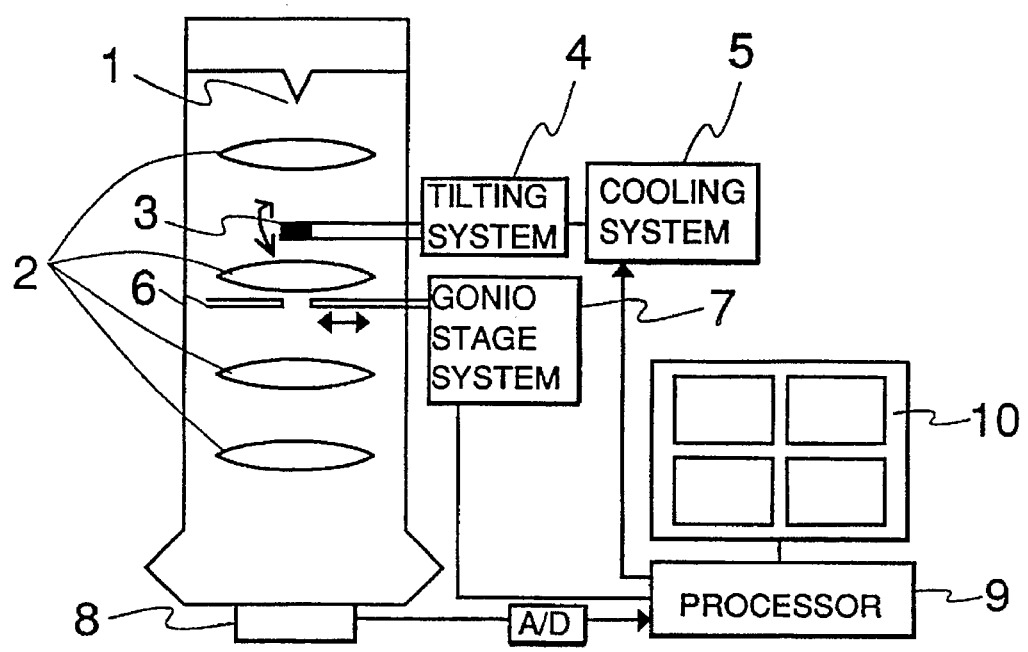
FIG. 1 is an entire configuration diagram showing an embodiment of the present invention.

Hereafter, embodiments of the present invention will be described by referring to drawings. FIG. 1 shows the basic configuration of an embodiment of an electron microscope according to the present invention. The apparatus includes a thermal field emission electron gun 1, an electronic lens 2, a double tilt specimen holder 3, a specimen cooling system 5, a specimen tilting system 4, an objective aperture 6, an objective aperture gonio stage system 7, an electron beam detector 8, a processor for control and image processing 9, and an image display device 10.

Figure 2:
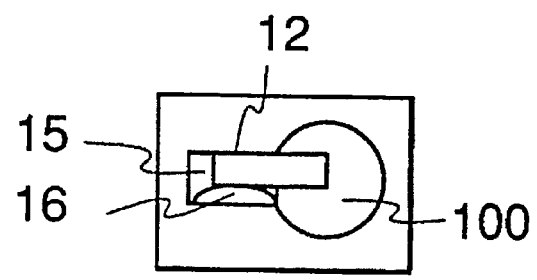
FIG. 2A is a top view of a specimen holder.
FIG. 2B is an oblique view of the specimen holder attached to an outer frame.
Figure 2:
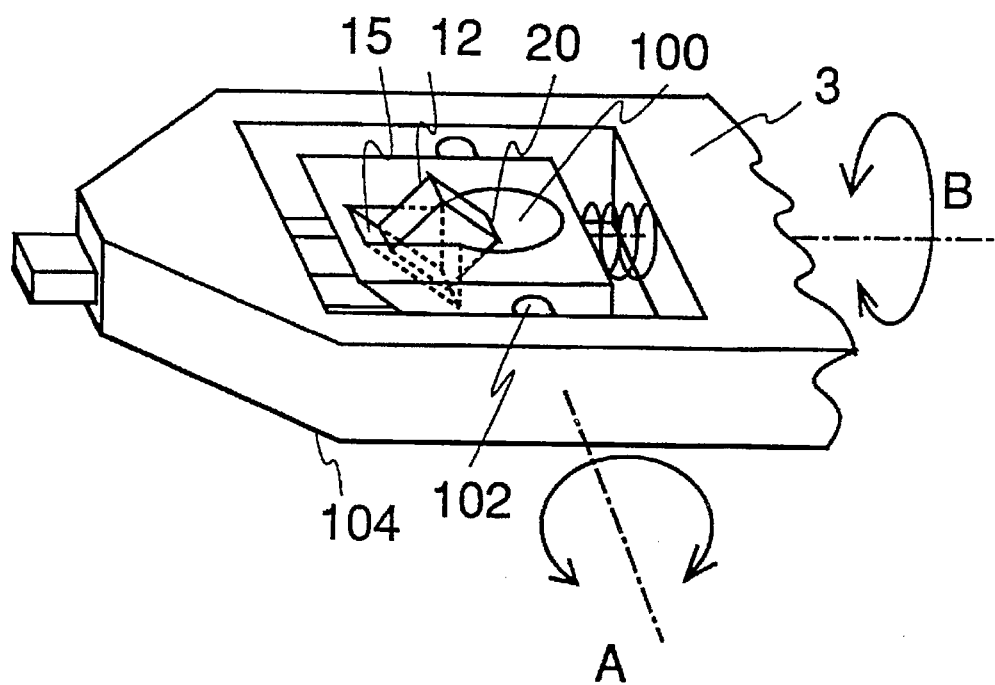

As the electron beam source, the thermal field emission electron gun 1 having high luminance is used. For the specimen holder 3, the specimen cooling system 5 for preventing damage of the specimen caused by illumination of a high-density electron beam is provided. As the electron gun 1, the electronic lens 2, the holder 3, the aperture 6, and the detector 8, corresponding components of a transmission electron microscope (model H-800) produced by Hitachi Ltd. can be used. In this case, acceleration voltage of electron beam is 200 kV and the current value on the specimen is $10^{-9}$ A. As shown in FIGS. 2A and 2B, the specimen holder 3 has a hole 100 for passing the electron beam therethrough and a slant face 15 for placing a specimen 12 thereon. The slant face 15 has an angle of nearly 45 degrees with respect to the illumination axis of the electron beam. By placing one cleavage plane of the specimen 12 on the slant face, an edge of another cleavage plane of the specimen 12 is positioned nearly in the center of the hole 100 and an electron beam is impinged upon the cleavage plane. Since cleavage planes of the specimen 12 are substantially perpendicular to each other, the cleavage plane subjected to electron illumination crosses the electron beam at an angle of approximately 45°. In FIG. 2A, numeral 16 denotes a spring plate. The specimen 12 is energized toward a vertical plane of the holder 3 and thereby fixed to the holder 3. The holder 3 is rotatably attached to the outer frame 104 by a shaft 102. The axis of rotation of this shaft 102 crosses the electron beam and the shaft 102 is rotated in a direction indicated by an arrow A in FIG. 2B. In addition, the outer frame 104 is rotated in a direction of an arrow B by a rotating shaft (not illustrated) having an axis of rotation crossing the electron beam. As a result, the specimen 12 can be tilted in a double-tilt direction. The direction of rotation and the amount of rotation of each rotating shaft are arbitrarily controlled from the outside by the specimen tilting system 4.

Figure 3:
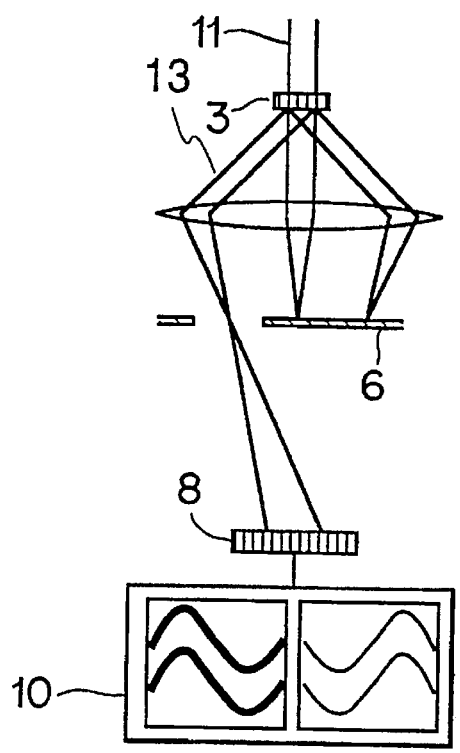
FIGS. 3A and 3B are diagrams showing a control system for simultaneously displaying a plurality of dark-field images having different plane indexes of the same specimen.
Figure 3:
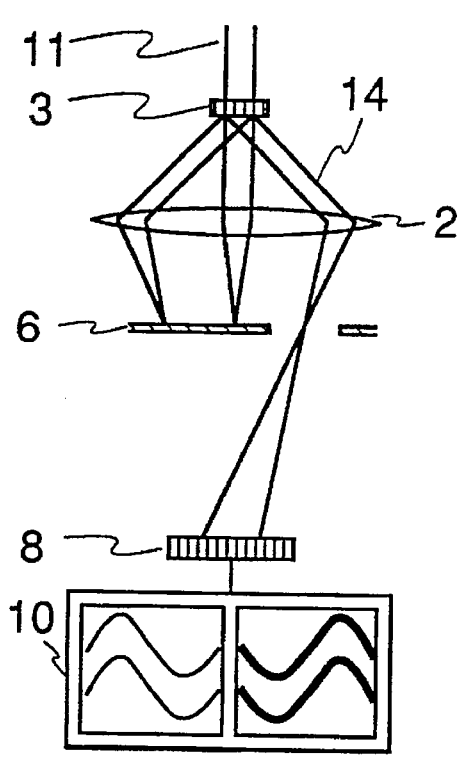

The objective aperture gonio stage system 7 includes an encoder, an actuator, and a step motor and allows position setting at a rate of at least ten places per second and at position precision of one μm or less. The objective aperture 6 is moved at high speed by the system 7 between a first position in which a diffractive wave having a first plane index passes through the aperture 6 and a second position in which a transmitted wave passes through the aperture 6. The objective aperture 6 projects dark-field images and bright-field images in accordance with the position thereof. The objective aperture 6 may be moved to a third position in which a diffractive wave having a second plane index passes therethrough. In synchronism with the position of the objective aperture 6, the electron beam detector 8 outputs image signals. A plurality of dark-field images and bright-field images described above are transmitted to a display screen 10 without being overlapped each other. These positions of the objective aperture 6 and the display screen 10 are controlled by the processor 9. As shown in FIG. 3A, for example, an image signal of a 00–n dark-field image obtained when the objective aperture 6 is moved to the position of a (00n) diffracted wave 13 is displayed on the left display screen 10 until the next image signal of the 00n dark-field image arrives thereat. Then as shown in FIG. 3B, an image signal of a 00–n dark-field image obtained when the objective aperture 6 is moved to the position of a (00–n) diffracted wave 14 is displayed on the right display screen 10 until the next image signal arrives thereat. By implementing the states of FIG. 3A and FIG. 3B alternately at intervals of a fixed time, the (00n) dark-field image and the (00–n) dark-field image fed from the same specimen are simultaneously displayed on the left and right display screens so that both dark-field images can be observed and compared with each other.

As the electron beam detector 8, a favorable light receiving element having at least 1000×1000 pixels, high sensitivity, and favorable linearity, such as a slow-scan CCD, is used. The display screen 10 has a plurality of display regions. Various observation images and analysis images can be displayed simultaneously on each display region. Furthermore, by using image processing software, an observation image and an analysis image can be displayed on the same display region so as to be overlapped each other.

An embodiment of a measuring method according to the present invention will now be described by taking a strained superlattice specimen of a compound semiconductor as an example.

Figure 5:
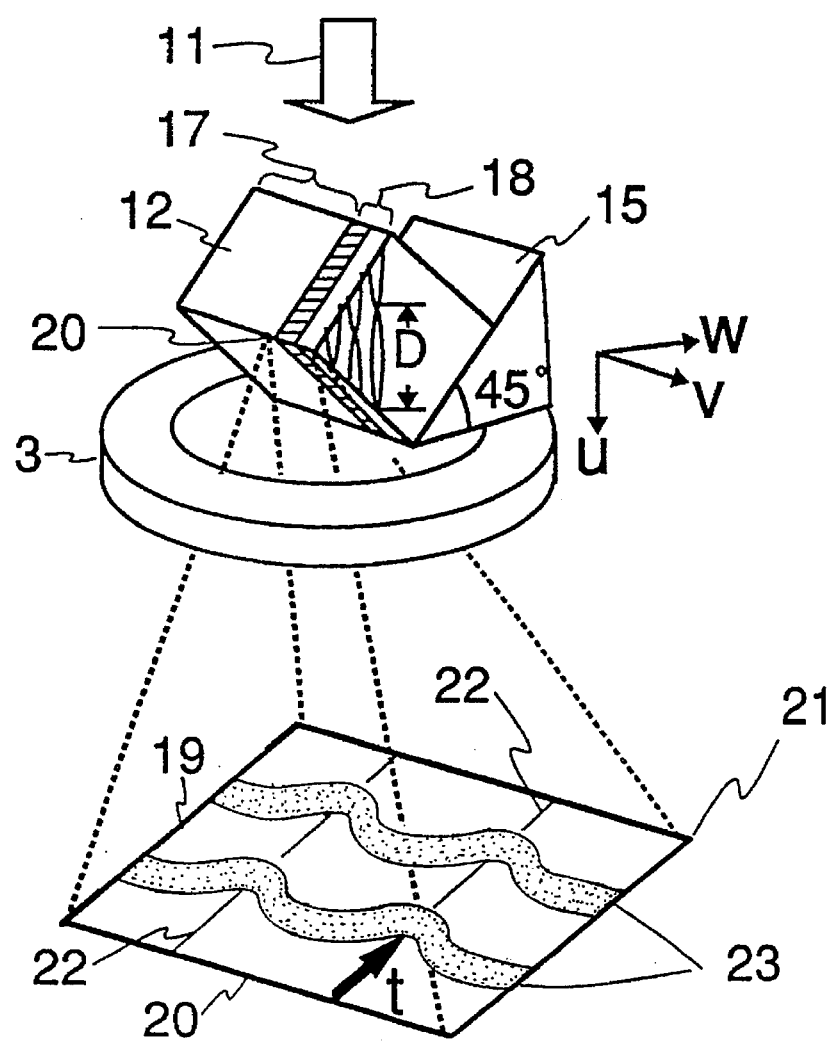
FIG. 5 is a diagram showing a transmission image obtained when an electron beam is incident upon a wedge-shaped specimen.

First of all, a method for fabricating a specimen will be described. A specimen formed on a substrate is cleaved and cut out in a wedge form. In a GaAs crystal and an InP crystal typically used as the substrate, the surface is a (001) plane and (110), (1-10), (–110) and (–1-10) planes are easy cleavage planes. Since the surface and the cleavage planes are perpendicular to each other, a scratch mark is formed on the surface by using a scriber or the like and the surface is cleaved. Thereby a wedge-shaped specimen having a cross-sectional structure exposed on the cleavage plane is cut out. The angle of a wedge edge 20 shown in FIG. 2B and FIG. 5 is 90 degrees, and the cleavage plane becomes flat on the order of atoms. As a result, the specimen thickness linearly increases from the wedge edge 20.

Figure 4:
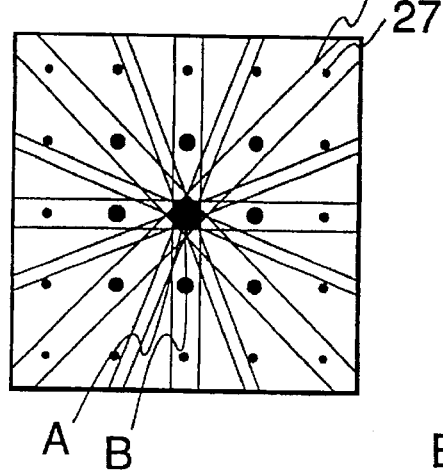
FIGS. 4A and 4B are diagrams showing the positional relation between a diffraction spot and a Kikuchi lines pattern.
Figure 4:
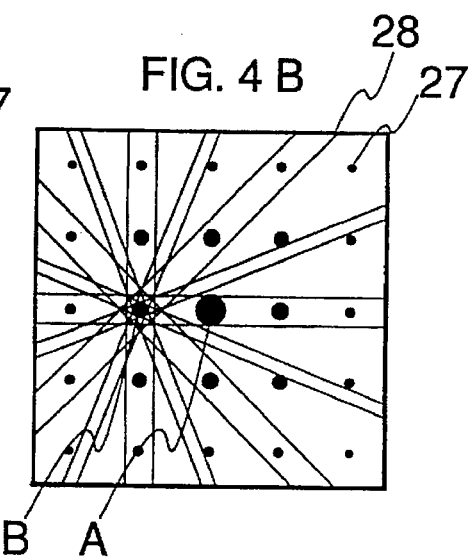

A method for impinging an incident electron beam 11 to the cross section of the above described specimen while controlling the incidence angle will now be described by referring to FIGS. 4A, 4B and 5. The wedge-shaped specimen 12 is fixed to a specimen fixing table 15 located on the specimen holder 3 capable of performing double tilt so that the cleavage plane may be oriented upward. The specimen thus fixed is inserted into the specimen chamber of the transmission electron microscope. The incidence direction of the electron beam, the crystalline growth direction, and the direction of increase of specimen thickness from the wedge edge are denoted by U, V and W, respectively. The electron beam 11 accelerated to several hundreds kV is impinged to a thin specimen portion located at the wedge edge at an angle of 45 degrees with respect to the above described cleavage plane, i.e., from the U direction. Since the cleavage plane has either of the above described four plane indexes, the electron beam 11 is incident from either of [100], [010], [0-10] and [–100] directions. Fine adjustment of the incidence angle of the electron beam 11 with respect to the specimen 12 is conducted by using the tilting system of the double tilt holder 3 while observing the diffraction pattern.

In case the specimen is thin, a diffraction spot 27 appears in the diffraction pattern. In case the specimen is thick, a Kikuchi lines pattern 28 appears in the diffraction pattern. While moving the incidence position of the electron beam in such a direction as to increase the thickness from the wedge edge, i.e., in the W direction, the diffraction pattern is observed and such a thickness position that the intensity of the diffraction spot 27 and the intensity of the Kikuchi lines pattern 28 appear at nearly the same degree is selected. When the incidence angle of the electron beam has changed under this state, the intensity of the diffraction spot 27 changes but the position does not change. On the other hand, the Kikuchi lines pattern 28 has such a character that its intensity does not change but its position changes. For example, if the incidence direction of the electron beam 11 is parallel to the lattice plane, the symmetry center A of the diffraction spot 27 coincides with the symmetry center B of the Kikuchi lines pattern 28 as shown in FIG. 4A. If the incidence direction of the electron beam 11 is not parallel to the lattice plane, however, the symmetry center A of the diffraction spot 27 deviates from the symmetry center B of the Kikuchi lines pattern 28 as shown in FIG. 4B. By utilizing this, the deviation of the incidence angle of the electron beam 11 with respect to the specimen 12 can be determined with precision of one to two mrad on the basis of the positional relation between the diffraction spot 27 and the Kikuchi lines pattern 28. By tilting the specimen 12 by using the double tilt holder 3, the deviation of the incidence angle is corrected and the electron beam is made parallel to the lattice plane. When there is no strain in the specimen, an analysis is made on bright-field images of the specimen thus tilted in accordance with the conventional method.

If an analysis software for judging the symmetry of figures is used, it is possible to automatically carry out the process of inputting a diffraction pattern to the processor, detecting the symmetry center A of the diffraction spot 27 and the symmetry center B of the Kikuchi lines pattern 28, and tilting the double tilt holder 3 so as to square the symmetry center A with the symmetry center B.

Under the specimen 12 tilted as described above, the objective aperture 6 is inserted so that only a desired transmitted wave or diffracted wave may pass through the aperture 6. Thereby, a transmitted image 19 of fifty thousand to sixty thousand magnifications is observed. As shown in FIG. 5, the cross-sectional structure of a strained superlattice specimen such as a heterointerface 22 is observed in the transmitted image 19. At the same time, an equal thickness fringe 23 appearing as a result of the electron diffraction effect is observed.

The occurrence mechanism of the equal thickness fringe 23 is explained as hereafter described by referring to the electron diffraction phenomenon. The intensity of the transmitted wave and diffracted wave passing through a crystal periodically fluctuates in the thickness direction (U direction) as a result of the multiple-scattering effect. Intensities of the transmitted wave and diffracted wave at the time when they are emitted from the bottom plane of the specimen are reflected in the transmitted image 19. In the wedge-shaped specimen 12 having thickness increased linearly, therefore, the intensity of transmitted electrons differs depending upon the thickness. It appears on the transmitted image 19 as periodic contrast of light and darkness in the W direction, i.e., the equal thickness fringe 23.

If two-wave approximation (supposing that there are only a transmitted wave and one strong diffracted wave as electron waves within the crystal) is used for brevity, the electron wave intensity within the crystal vibrates with a period called extinction distance D. The extinction distance D changes according to composition and diffraction condition. In case the crystal is $A_xB_{1-x}$ (x indicates composition), the extinction distance D can be represented by the following expression.

$$D \propto [\{Xf_A + (1-x)f_B\} \cdot W(\theta)]^{-1} \text{ expression} \quad (1)$$

where $f_A$ and $f_B$ are atomic scattering factors of atom A and atom B, W is a function representing the electron diffraction condition, and $\theta$ is the incidence angle of the electron beam 11 with respect to the crystal plane.

If the composition x changes, the structure factor of the crystal of the first term changes. If there is strain, then the lattice plane locally inclines in order to attain lattice match and the incidence angle $\theta$ of the electron beam 11 changes, and hence the electron diffraction condition of the second term changes. If the extinction distance D is changed by a composition change and a lattice plane inclination, then the distance from the specimen edge to the equal thickness fringe 23 on the transmitted image 19, for example such as a distance t from the specimen edge to the first line of the equal thickness fringe changes. In a region where the distance t of the equal thickness fringe 23 has changed, therefore, at least one of a composition x and an angle $\theta$ of a lattice plane is regarded to be changed.

Information of compositions and lattice planes of various plane indexes is included in the change of distance $\underline{t}$ of the equal thickness fringe 23. In the conventional composition distribution measuring method, therefore, the composition distribution cannot be analyzed unless the condition that the angle $\theta$ of a lattice plane does not change is satisfied. Furthermore, in the conventional strain distribution measuring method, the angle $\theta$ of a lattice plane cannot analyzed unless the condition that the change of distance $\underline{t}$ of the equal thickness fringe due to the composition change can be neglected is satisfied. That is, in the above described two conventional techniques, the composition and strain distribution of a specimen in which the composition change and the angle $\theta$ change of the lattice plane are mixed cannot be analyzed.

Furthermore, in the conventional strain distribution measuring method, there is introduced the assumption that the angle $\theta$ of the lattice plane is constant with respect to the direction of incidence of an electron beam. As for the strain, in some case the lattice may be tilted and in some case the lattice may be curved. Accordingly, the above described assumption is not always valid upon a general specimen. Furthermore, in the conventional strain distribution measuring method, information of lattice planes of respective plane indexes cannot be obtained, so that the strained structure cannot be analyzed 3-dimensionally.

In the above described two conventional techniques, analysis is performed by using only the equal thickness fringe on bright-field images observed in a certain diffraction condition, so that the above described problems cannot be solved.

Electron beams incident to a crystal are diffracted by lattice planes of various plane indexes to thereby form diffracted wave. Electron beams not diffracted form transmitted wave. A transmission image formed by (khl) diffracted wave diffracted by a certain khl lattice plane is called khl dark-field image and a transmission image formed by transmitted wave is called bright-field image. The khl dark-field image intensively reflects information of the khl lattice plane. On the other hand, the bright-field image reflects information of lattice planes of all plane indexes.

In this embodiment, therefore, dark-field images of various plane indexes in addition to bright-field images are observed in various diffraction conditions and difference between equal thickness fringes 23 on the observed images is analyzed to thereby perform the quantitative analysis of the two in a specimen having a mixture of composition change and lattice plane tilting, perform the analysis of the strained structure in a specimen having a lattice plane curved and perform the reconstruction of a 3-dimensional strained structure synthesized from information of lattice planes of respective plane indexes.

In this embodiment, equal thickness fringes on the darkfield image and bright-field image of each plane index are observed and analyzed in accordance with a procedure shown in FIG. 6 by using the above described objective aperture gonio stage system 7, electron beam detector 8, processor 9 for control and image processing, and image display device 10.

First of all, a bright-field image and/or a dark-field image of a predetermined order is observed to detect the region where the position t of equal thickness fringe 23 thereof is changing (step 1).

Then at step 2, it is determined whether there is angle change in a lattice plane by comparing a dark-field image formed by a diffracted wave from the obverse of a lattice plane represented by a certain plane index with a dark-field image formed by a diffracted wave from the reverse, i.e., comparing dark-field images of opposite indexes.

If there is no angle change, then processing proceeds to step 6 to make a composition distribution analysis according to the conventional technique.

If there is an angle change of a lattice plane, then dark-field images of opposite signs are observed in various diffraction conditions at step 3 to thereby judge whether the angle change of the lattice plane of each plane index is of a tilting type or of a curve type.

If the angle change of the lattice plane of a certain plane index is of a tilting type, then the tilting angle of the lattice plane of the plane index is measured at step 4.

If the angle changes of lattice planes of all plane indexes are of a tilting type, equal thickness fringes after removal of the influence of strain are reconstructed by referring to measurement results of the tilting angles of the lattice planes of the respective plane indexes (step 5) and the composition distribution is analyzed from the thus reconstructed equal thickness fringes in the same manner as in the conventional technique (step 6). In the conventional technique, equal thickness fringes on bright-field images are used. The composition distribution can be analyzed also by using equal thickness fringes on dark-field images in the same manner as in the conventional technique.

If there is a lattice plane having the angle change of a curve type, then the composition distribution is measured at step 8 and the quantities of curvature of lattice planes of respective plane indexes are analyzed at step 9.

The 3-dimensional strained structure is analyzed on the basis of the thus obtained analysis results of the angle changes of lattice planes of various plane indexes (step 10).

At step 7, the cross-sectional structure of the crystal, the strained structure of the lattice, and composition distribution are simultaneously displayed on the CRT.

Aforementioned analysis of composition distribution is described in the aforementioned JP-A-62-26755, Kakibayashi et al., Japanese Journal of Applied Physics, Vol. 26, No. 5, May (1987), pp. 770–771 and Kakibayashi et al., Japanese Journal of Applied Physics, Vol. 25, No. 11, November (1986), pp. 1644–1649. Aforementioned measurement of lattice plane inclination angle distribution is described in the aforementioned Kakibayashi et al., Japanese Journal of Applied Physics, Vol. 30, No. 1A, January (1991), pp. L52–L55. These four documents are incorporated herein by reference.

Hereafter, details of each process of observation and analysis will be described.

At step 1, a selection is made as to the dark-field image or bright-field image of which plane index is suitable for observation of composition and strain of the specimen. Because the change value of the distance t of the equal thickness fringe 23, i.e., the change value of intensity distribution, with respect to a composition change or a lattice plane inclination differs depending upon the crystal structure of a specimen. The analysis of composition distribution is made on a dark-field image or a bright-field image of a plane index which maximizes the change value of the distance t of the equal thickness fringe 23 for a composition change. On the other hand, the change value of the distance t of the equal thickness fringe 23 for a lattice plane inclination becomes larger as the order of the plane index of the dark-field image becomes higher. Since the electron beam intensity of a diffracted wave of high order is weak, however, the contrast of the equal thickness fringe 23 is small and the image becomes unclear. The plane index of the dark-field image used for analysis of the lattice plane inclination value is determined in due consideration of the above described condition. It is efficient to use calculation based upon the theory of electron diffraction in the above described selection process. In a case where an $Al_xGa_{1-x}As$ crystal is observed by an electron beam with [100] incident angle, it is desired that the plane index is (020) or (002).

Figure 14:
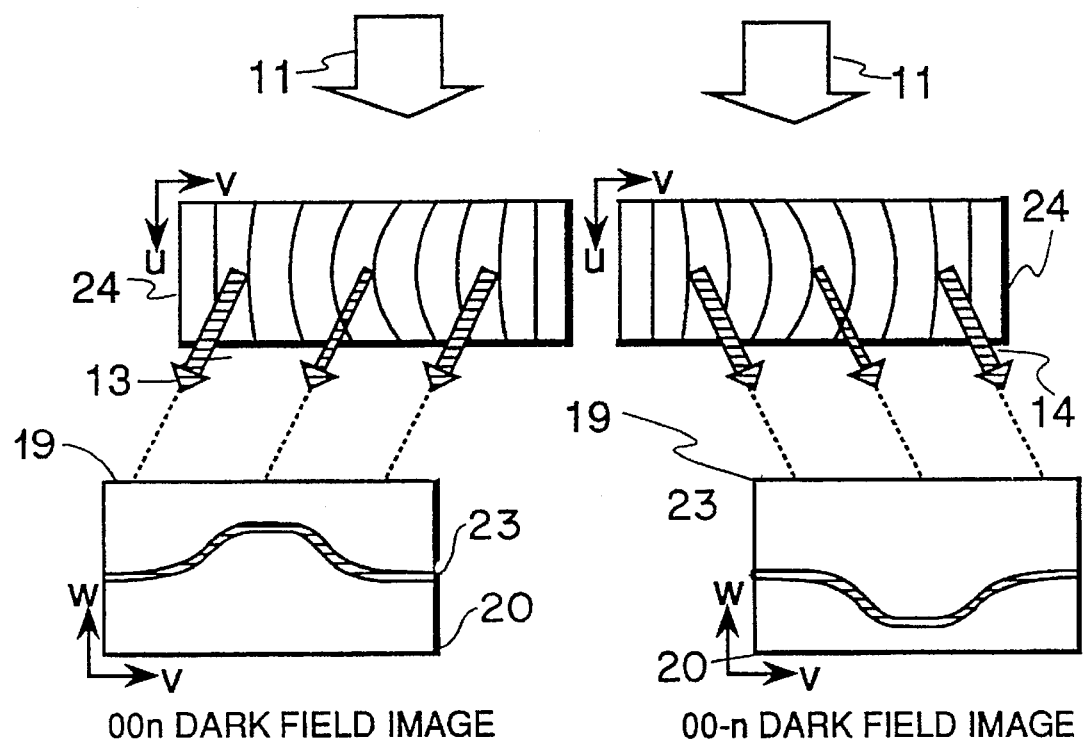
FIGS. 14A and 14B are diagrams showing the distance of the equal thickness fringes on dark-field images of opposite signs in a specimen having a partially curved lattice plane.

A method of judging whether the angle of a lattice plane of a certain plane index with respect to the incident electron beam is changed by strain or not, will be described below (step 2). First, the angle change of a (00n) lattice plane and the change of distance $\underline{t}$ of the equal thickness fringe 23 on a 00±n dark-field image in a specimen will be described with reference to FIGS. 14A and 14B. FIGS. 14A and 14B show a certain uv section of the specimen 12. It is assumed that the lattice plane has an angle distribution in the direction of incidence of an electron beam (u direction) and in the direction of growth of crystal (v direction). The left and right ends of the specimen 12 are made a non-strained region, and the center portion of the specimen 12 is made a strained region in which the (00n) lattice plane 24 is curved by strain. Here, after the specimen 12 is set so that the (00n) lattice plane 24 in the non-strained region becomes parallel with the incident electron beam 11, the electron beam 11 is made incident to the specimen 12. The electron beam 11 incident to the specimen 12 is diffracted by the front and rear surfaces of the (00n) lattice plane 24 simultaneously to form (00n) diffracted wave 13 and (00–n) diffracted wave 14 respectively. The residual part forms transmitted wave. Difference between equal thickness fringe 23 on a 00n dark-field image 19 (FIG. 14A) of the specimen 12 formed by the (00n) diffracted wave 13 and equal thickness fringe 23 on a 00n dark-field image 19 (FIG. 14B) of the specimen 12 formed by the (00–n) diffracted wave 14 will be considered. The difference of distance $\underline{t}$ of the equal thickness fringe 23 is the difference of extinction distance. Principal factors determining the extinction distance are the structure factor of the crystal and the electron diffraction condition of the crystal. Structure factors of the crystal of the 00±n diffracted waves 13 and 14 passed through the same specimen are equal. In the non-strained region, the electron diffraction condition is constant because the lattice plane angles $\theta_{00\pm n}(u)$ of the 00±n diffracted waves 13 and 14 with respect to the incident electron beam are equal. In the strained region, however, a difference is caused in the electron diffraction condition because the (00±n) lattice plane angles $\theta_{00\pm n}(u)$ are different.

That is, when the specimen 12 is set by using diffraction patterns so that the (00n) lattice plane 24 in the non-strained region is parallel with the incident electron beam 11 and the distances $\underline{t}$ of the equal thickness fringes 23 on the 00±n dark-field images 19 are compared with each other, a decision can be made that the (00n) lattice plane 24 in the region in which the two are different has its angle changed by strain with respect to the incident electron beam.

A method of judging whether the angle change of the lattice plane is of a lattice plane tilting type so as to be constant with respect to the direction of incidence of the electron beam or of a curve type having a distribution will be described below (step 3).

Figure 7A:
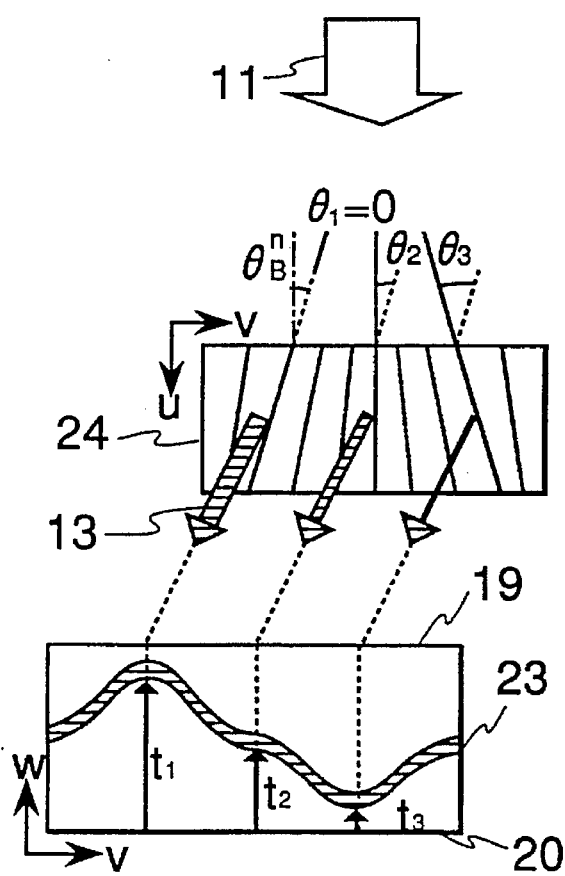
FIGS. 7A and 7B are diagrams showing the distance of the equal thickness fringe on dark-field images of opposite plane indexes in a specimen having a lattice plane partially inclined.
Figure 7B:
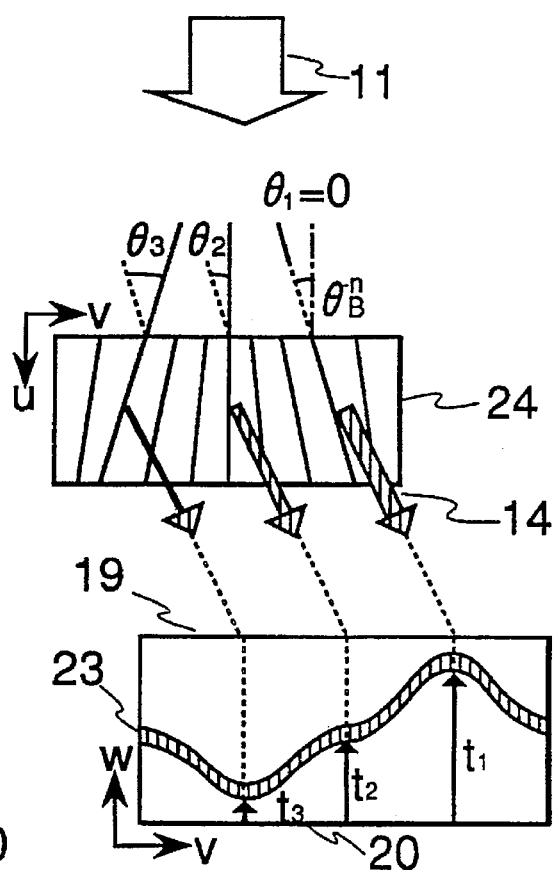

Here, a dark-field image of a specimen 12 having a lattice plane tilted as shown in FIGS. 7A and 7B is considered. It is now assumed that the tilting angle distribution of the lattice plane depends on the distance from the heterointerface (wu plane). The tilting angle distribution of the lattice plane is a function with respect to the v direction. The function is made constant in the wu plane, so that the uv section is used as a view showing the tilting angle distribution of the lattice plane. The electron beam 11 is made incident to the specimen in which the (00n) lattice plane 24 is tilted by strain symmetrically in the left and right strained regions. Here, the specimen 12 is set so that the (00n) lattice plane 24 in the non-strained region is parallel with the incident electron beam 11.

Referring to FIG. 7A, a change of the distance t of the equal thickness fringe 23 on the 00n dark-field image 19 formed by the (00n) diffracted wave 13 will first be described. Bragg diffraction conditions of the 00n diffracted wave respectively in the left strained region, unstrained regions located at both ends and the central part of the crystal, and the right strained region becomes as described below. The deviation value of the 00n diffracted wave from the Bragg diffraction condition is represented by the deviation angle of the lattice plane from the Bragg angle of the 00n diffracted wave. The deviation angle in the left strained region is $\theta_1(\theta_1=0)$. In the unstrained region, the deviation angle becomes $\theta_2(|\theta_2|>|\theta_1|)$. In the right strained region, the deviation angle becomes $\theta_3(|\theta_3|>|\theta_2|)$. As the deviation angle approaches 0, the electron diffraction condition W of the expression (1) becomes small and the extinction distance D becomes large, and hence the distance t of the equal thickness fringe 23 becomes long. At the deviation angle $\theta_1=0$ in the left strained region, the distance of the equal thickness fringe becomes $t_1$ which is the longest. At the deviation angle $\theta_2$ in the unstrained region, the distance of the unstrained region becomes $t_2$ which is shorter than $t_1$. At the deviation angle $\theta_3$ in the right strained region, the distance of the equal thickness fringe becomes $t_3$ which is shorter than $t_2$.

Referring to FIG. 7B, the change of the position t of the equal thickness fringe 23 of the 00–n dark-field image 19 formed by the diffracted wave (00–n diffracted wave 14) fed from a (00–n) lattice plane, which is the reserve of the (00n) lattice plane will now be described. The Bragg diffraction condition of the 00–n diffracted wave, i.e., the deviation angle of the lattice plane from the Bragg angle of the 00–n diffracted wave becomes as described below. Since the deviation angle in the right strained region is $\theta_1=0$, the distance of the equal thickness becomes $t_1$. Since the deviation angle in the unstrained region is $\theta_2$, the distance of the equal thickness fringe becomes $t_2$. Since the deviation angle in the left strained region is $\theta_3$, the distance of the equal thickness fringe becomes $t_3$. Therefore, the shape of the equal thickness fringe 23 on the 00n dark-field image 19 is exactly reversed.

The distances $\underline{t}$ of the equal thickness fringes 23 on the 00±n dark-field images 19 are compared with each other.

The coincidence between the distances $t$ of the equal thickness fringes 23 shows the fact that the (00n) lattice plane 24 in the region is parallel with the incident electron beam 11. If the angle change of the lattice plane is of a tilting type, the direction of tilting of the lattice plane can be identified by the size of the distance $t$ of the equal thickness fringe 23. The direction of tilting of the lattice plane 24 is the direction satisfied by the Bragg condition of diffracted wave of a plane index to make the distance $t$ of the equal thickness fringe 23 large.

Figure 8:
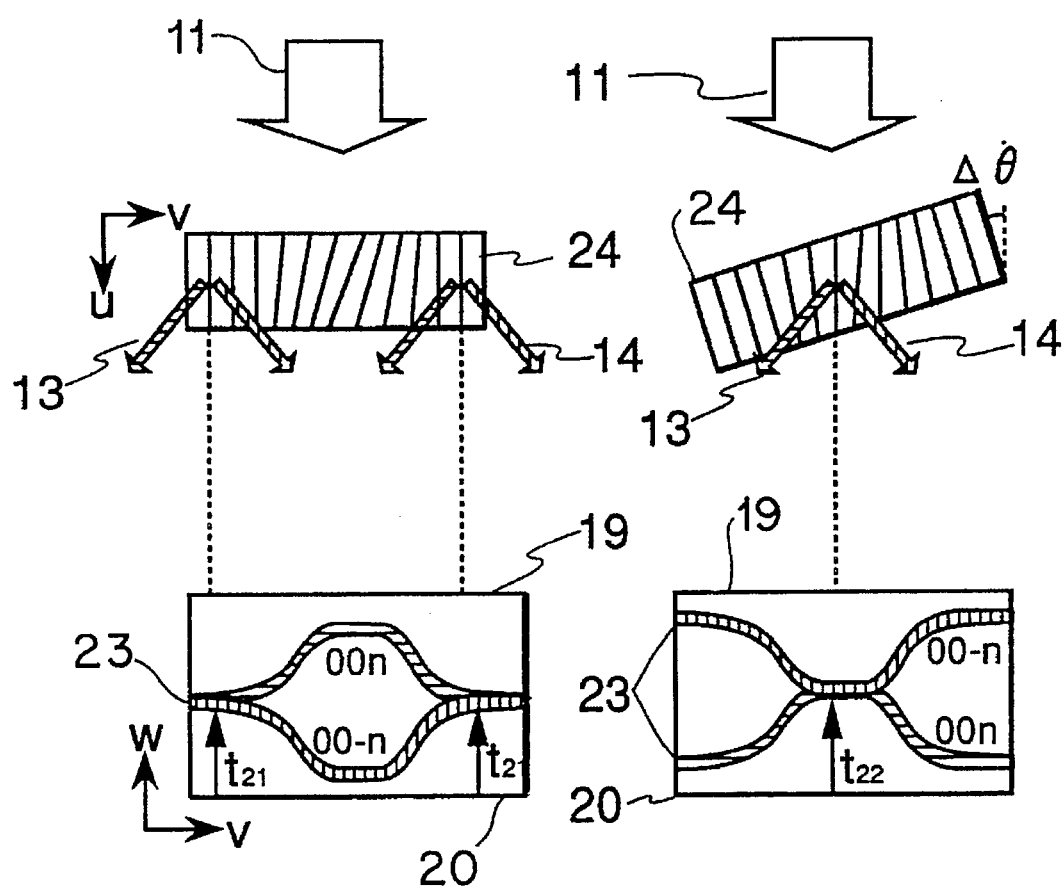
FIGS. 8A and 8B are diagrams showing the change of distance of equal thickness fringe on dark-field images of opposite signs when the specimen having the lattice plane partially inclined is tilted.

Next, the change of the distance $t$ of the equal thickness fringe 23 is considered in the case where the specimen 12 having a lattice plane 24 tilted is observed at various tilting angles. FIG. 8 shows the change of distance $t$ of the equal thickness fringe 23 on the 00±n dark-field image 19 of the specimen 12 having a lattice plane 24 tilted in the center portion. If the specimen 12 is not tilted (FIG. 8A), lattice planes 24 at opposite end portions of the specimen 12 are parallel with the incident electron beam 11. Accordingly, at the opposite end portions of the specimen 12, the distances of equal thickness fringes 23 on the 00±n dark-field image 19 coincide with each other and have a value of $t_{21}$. If the specimen 12 is tilted as shown in FIG. 8B, the position in which lattice planes 24 are parallel with the incident electron beam 11 moves to the center portion of the specimen 12. Accordingly, at the center portion of the specimen 12, the distances of equal thickness fringes 23 on the 00±n dark-field image 19 coincide with each other and have a value of $t_{22}$. If the composition of the specimen 12 at the opposite end portions is different from the composition of the specimen 12 at the center portion, $t_{21}$ and $t_{22}$ are different from each other but there is no change of the phenomenon that the distances of equal thickness fringes 23 on the 00±n dark-field image 19 are made coincident with each other when the lattice planes 24 become parallel with the incident electron beam 11.

Next, the change of the distance $t$ of the equal thickness fringe 23 is considered in the case where the specimen 12 having a lattice plane 24 curved at the center portion is observed at various tilting angles (FIG. 15). If the lattice plane 24 is curved, then the angles of (00±n) lattice planes 24 with respect to the incident electron beam 11 are not coincident with each other, that is, the diffraction conditions of 00±n diffracted waves are not coincident with each other even in the case where the specimen 12 is tilted at any angle. Accordingly, the distances $t$ of equal thickness fringes 23 on the 00±n dark-field image 19 are not coincident with each other.

From the above considerations, it can be decided that when the specimen 12 is tilted while equal thickness fringes 23 on the 00±n dark-field image 19 are compared with each other, the (00n) lattice plane in the strained region is tilted by strain so long as there is any specimen tilting angle at which the distances $t$ of equal thickness fringes 23 in the strained region are coincident with each other or the (00n) lattice plane in the strained region is curved by strain so long as there is no specimen tilting angle.

If the angle change of a lattice plane of a certain plane index is of a tilting type, then the tilting quantity distribution of the lattice plane is measured (step 4). The tilting angle distribution of the lattice plane is measured on the basis of the change of the distance $t$ of the equal thickness fringe 23 at the time of observation of the specimen 12 at various tilting angles. The following two methods are thought of as methods for measuring the tilting angle distribution of lattice planes.

Figure 9:
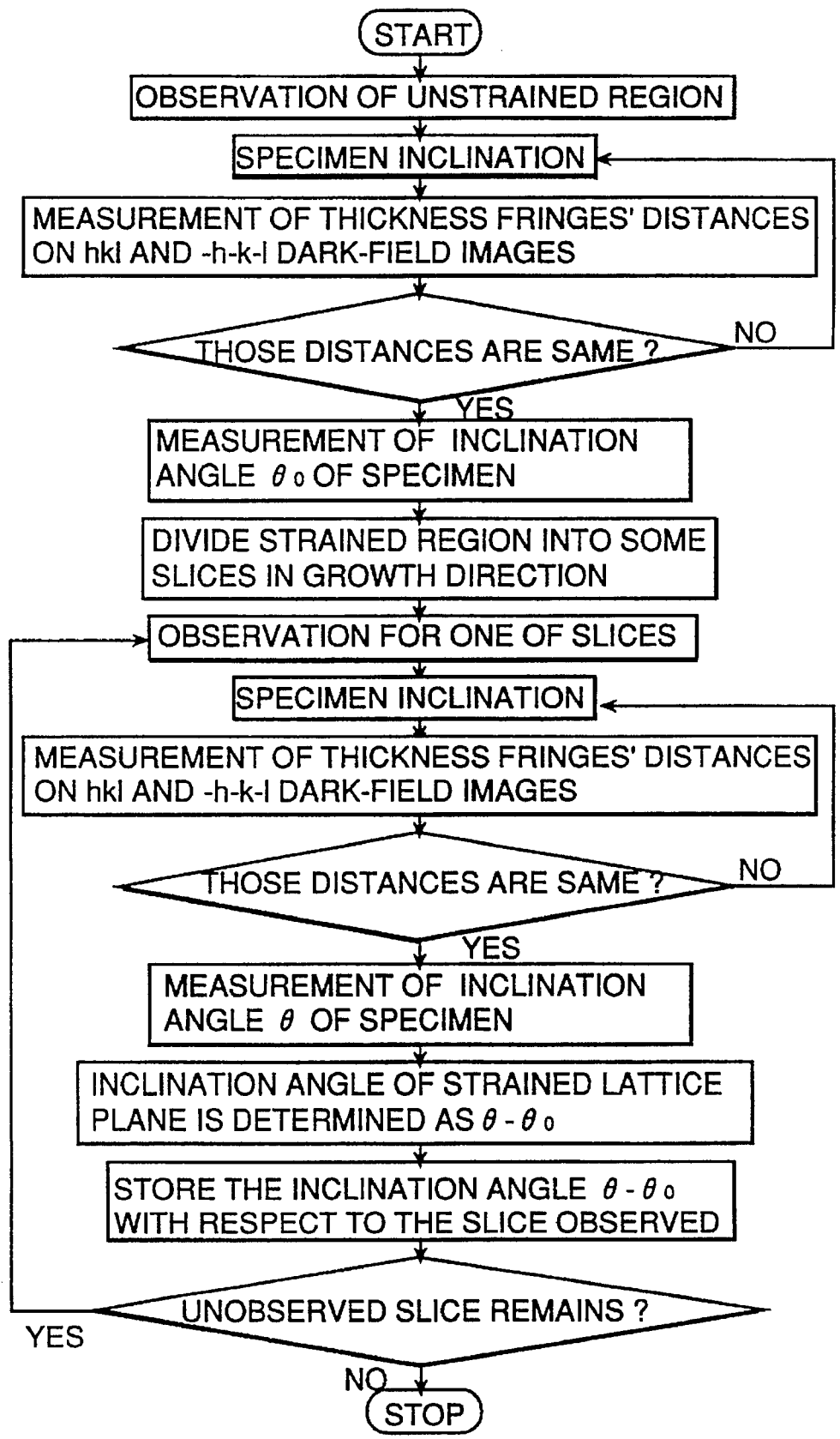
FIG. 9 is a flow chart for measuring the inclination angle distribution of the lattice plane by using the difference between equal thickness fringes on dark-field images of opposite signs.

One is the method using the above described principle in which the distances $t$ of equal thickness fringes 23 on dark-field images 19 of opposite signs are made coincident with other when the lattice plane of the plane index is parallel with the incident electron beam. FIG. 9 shows the measurement procedure for the above described measurement. That is, while the specimen 12 is tilted, the specimen tilting angle θ at which the distances $t$ of equal thickness fringes 23 on the ±00n dark-field image 19 coincide with each other is detected in respective regions successively. The difference Δθ between the tilting angles of the specimen 12 in FIGS. 8A and 8B is the distance between the tilting angle of the lattice plane at the center portions of the specimen 12 and the tilting angle of the lattice plane at opposite end portions of the specimen 12. That is, if the tilting angle of the specimen in the non-strained region sufficiently far from the heterointerface is $\theta_0$ and the tilting angle of the specimen in a certain strained region is θ, then the tilting angle of the lattice plane in the strained region is made $\theta-\theta_0$.

The other of the two lattice plane inclination angle measuring methods utilizes such a phenomenon that the distance t of the equal thickness fringe 23 becomes the longest when the deviation angle of the lattice plane 24 from the Bragg angle is zero. It is now assumed that the 00n diffracted wave 13 is emitted from the specimen 12 having an inclined lattice plane 24 of the central part as shown in FIGS. 10A and 10B. The change of the distance $t$ of the equal thickness fringe 23 on the 00n dark-field image 19 formed by such a 00n diffracted wave will now be described.

In case the specimen 12 is not inclined (FIG. 10A), the deviation angle of the lattice plane 24 of the central part from the Bragg angle becomes zero. Among various inclinations of the specimen 12, therefore, the distance of the equal thickness fringe 23 of the central part of the specimen 12 becomes the longest value $t_{11}$ when the specimen 12 is in the state shown in FIG. 10A. Assuming now that the specimen 12 is inclined as shown in FIG. 10B, regions where the above described deviation angle becomes zero are located at both ends. Therefore, the regions where the distance t of the equal thickness fringe 23 becomes the longest are located at both ends, and the distance t becomes a certain value $t_{12}$. In this case as well, $t_{11}$ is different from $t_{12}$ if both ends of the specimen 12 differ from the central part thereof in composition. However, there is no change in such a phenomenon that the distance t of the equal thickness fringe becomes the longest when the deviation angle is zero. The difference in lattice plane inclination angle between the central part of the specimen 12 and both ends thereof is equal to the difference Δθ in inclination angle of the specimen 12 between FIG. 10A and FIG. 10B.

Figure 11:
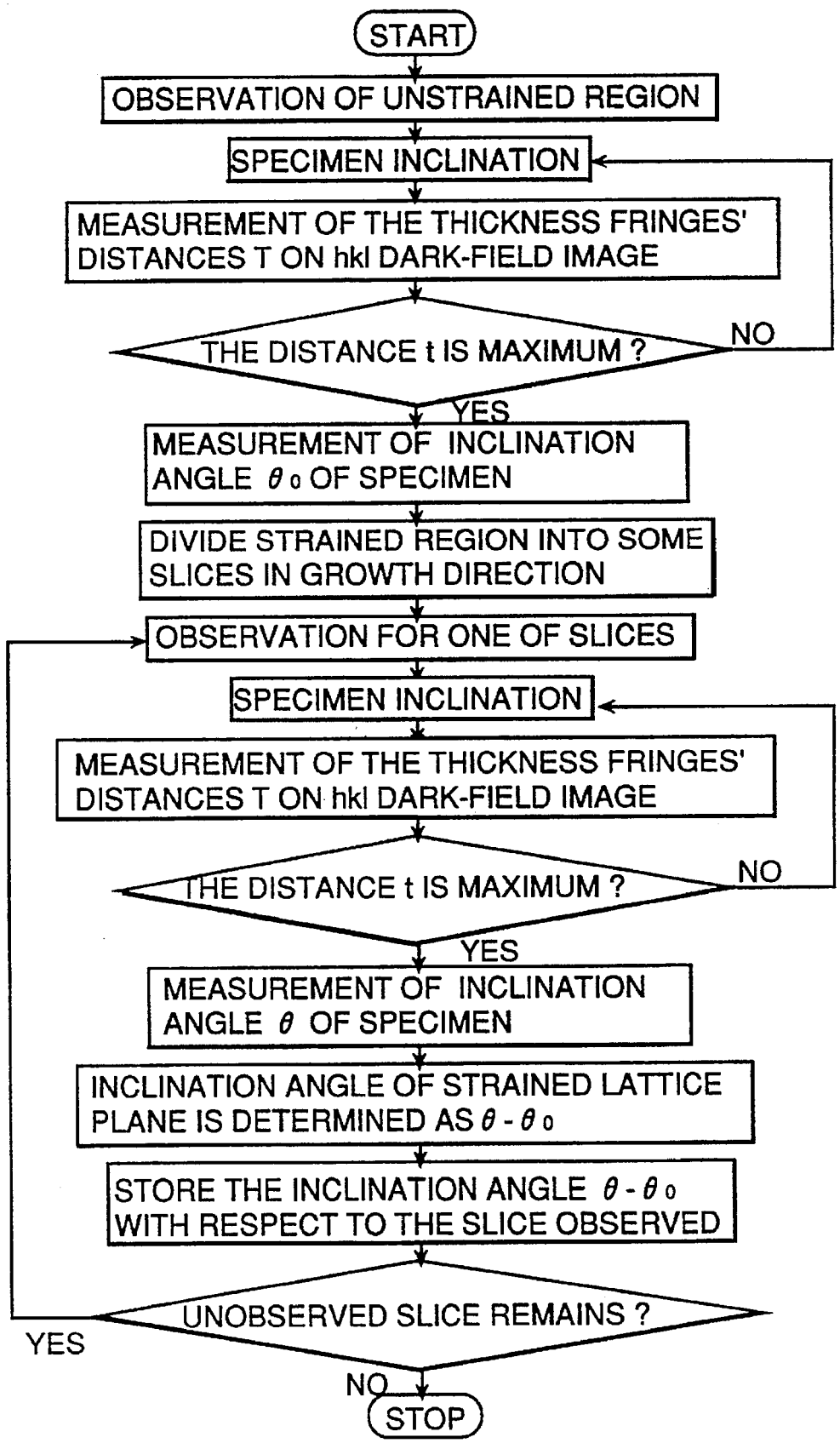
FIG. 11 is a flow chart for measuring the inclination angle distribution of the lattice plane by using the equal thickness fringe on the dark-field image.

By utilizing the above described principle, the lattice plane inclination angle distribution is measured in accordance with the procedure shown in FIG. 11. That is to say, while tilting the specimen 12, a specimen inclination angle θ whereat the distance t of the equal thickness fringe 23 becomes the longest is detected. Letting the specimen inclination angle in an unstrained region sufficiently separated from the heterointerface be $\theta_0$, the lattice plane inclination angle in a strained region becomes $\theta-\theta_0$.

Figure 13:
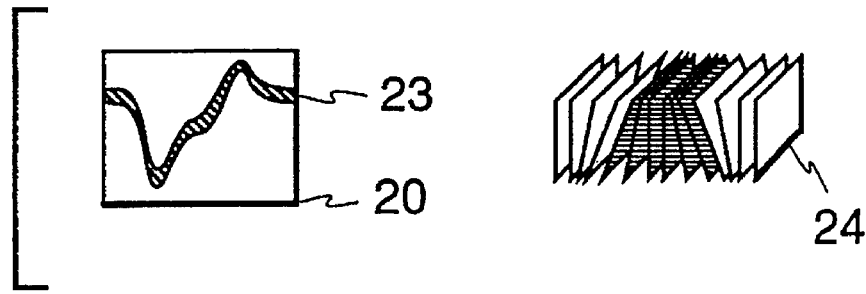
FIG. 13A is a diagram showing an equal thickness fringe obtained when a strained specimen is observed by using a conventional method.
FIG. 13B is a diagram showing a method for reconstructing an equal thickness fringe with the influence of strain removed.
Figure 13:
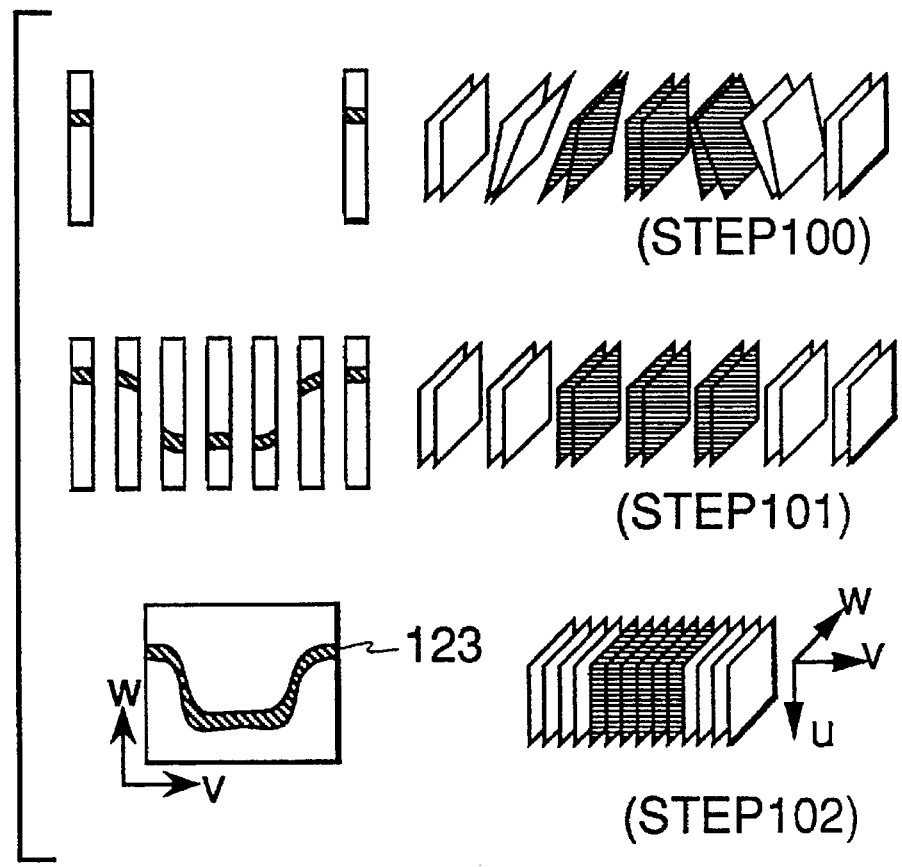

A method for removing the influence of strain from the observed equal thickness fringe 23 (step 5) and for reconstructing the equal thickness fringe 23 with only the influence of the composition change reflected (step 6) in order to analyze the composition distribution will now be described by referring to FIG. 13.

According to the conventional method, information of the composition change and information according to strain are contained in the observed equal thickness fringe (FIG. 13A). In this embodiment, a strained region of the specimen is first divided into some slices or some segments in the growth direction (V direction) in the same way as FIG. 9 or FIG. 11 (step 100 of FIG. 13B). The inclination angle of the lattice plane in each slice has already been preserved.

Then, an electron beam is impinged while changing the inclination angle of the specimen, i.e., changing the incidence angle. In the equal thickness fringe of the bright-field image obtained at that time, intensity distribution of a portion corresponding to a slice having a lattice plane substantially parallel to the electron beam is related to the slice and preserved. For example, when the specimen is not tilted at all, it is considered that slices on both sides of the specimen are upright and its crystalline lattice planes are parallel to the electron beam. As shown in step 100, therefore, intensity distributions of equal thickness fringes of portions corresponding to slices of both sides are preserved. In the same way, intensity distribution of the equal thickness fringe corresponding to such a state that the lattice plane of the crystal is parallel to the electron beam is preserved for every slice (step 101). The preserved intensity distributions are combined (step 102). A resultant equal thickness fringe 123 does not contain the influence of strain. That is to say, the change of the distance t of the equal thickness fringe 123 reflects only the composition change.

Finally, a quantitative analysis of composition distribution is made. First of all, simulation using the theory of electron diffraction is performed and relations of correspondence between the composition change value and the change value of the distance t of the equal thickness fringe 123 are derived beforehand. If the result of this simulation is used, distribution of composition in the growth direction (V direction) is analyzed on the basis of the change value of the distance t of the reconstructed equal thickness fringe 123.

Next, an analyzing method will be described in the case where the angle change of the lattice plane is curved. In this case, the quantity of curvature of the lattice plane is analyzed by comparison of equal thickness fringes 23 on dark-field and bright-field images of various plane indexes between observation image and simulation image. The intensity distribution of the equal thickness fringe 23 changes correspondingly to the composition of the crystal and correspondingly to the angle change of the lattice plane having each plane index. As the number of variables in simulation analysis increases, convergence and accuracy in calculation deteriorate.

Therefore, the composition distribution which can be measured by another measuring method is measured first and variables for simulation are reduced in number (step 8). As the other composition distribution measuring methods, for example, there is an analysis transmission electron microscope such as EDX, EELS, etc. If the composition changes continuously in the vicinity of the heterointerface (FIG. 14A), then the spatial resolution of the analysis transmission electron microscope is lower than that of the conventional composition distribution measuring method. Because the composition in each position is, however, estimated by interpolation so long as the period of the composition change is lower than the spatial resolution of the analysis transmission electron microscope, analysis can be made with the spatial resolution of the conventional technique. Incidentally, if the period of the composition change is high, then interpolation cannot be made so that the spatial resolution depends on that of the analysis transmission electron microscope. For example, the solid line of FIG. 16A shows the real composition distribution of specimen whereas the measurement by the analysis transmission electron microscope may be limited to the dotted line of FIG. 16A. The right composition change is measured correctly but the left composition distribution is ambiguous. Incidentally, if the composition changes precipitously at the heterointerface (FIG. 14B), then the interface precipitousness makes the specimen 12 rotate around the v axis while keeping the heterointerface parallel with the incident electron beam, so that the equal thickness fringe is hardly observed but can be estimated by "off axis" observation in which the contrast in each layer is made uniform. If the precipitous contrast change is observed in the heterointerface, then the interface width can be specified to be not larger than 0.5 nm. If the interface precipitousness and measurement results of the analysis electron microscope are combined, then the composition change can be measured accurately as shown in FIG. 14B.

Figure 19:
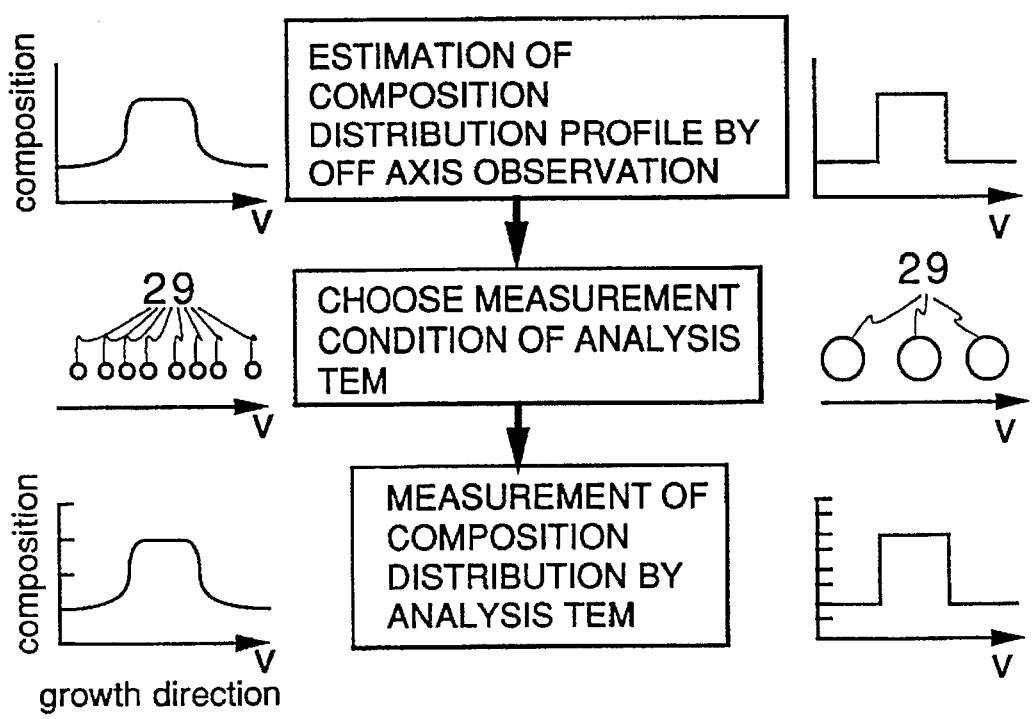
FIG. 19 is a flow chart for measurement of composition distribution using both off axis observation of and an analysis electron microscope a wedge-shaped specimen.

Based upon the above-discussion, explanation will be made for measurement of composition distribution in crystal growth direction (v direction) as shown in FIG. 19. First, a profile of the composition distribution is determined which one shown in FIG. 14A or FIG. 14B by an off axis observation. Condition for the measurement of composition distribution, for example in a case of using a TEM-EDX, is determined in accordance with the determination of the profile. The TEM-EDX uses an incident electron beam which is focused in a small diameter and irradiated on a sample. Wave length of an X-ray emitted from a position of the specimen on which the electron beam is irradiated is detected to analyze composition at the position of the specimen. Higher spatial resolution is obtained by irradiation of the electron beam with smaller diameter, but accuracy of analyzing the composition declines because an amount of emission of the X-ray decreases. To the profile of composition shown in FIG. 14A, spatial resolution for composition distribution depends on a diameter of the electron beam so that the beam must be focused to be a very small diameter and the beam is irradiated on the specimen, in particular in the vicinity of the heterointerface, with short intervals. To the profile of composition shown in FIG. 14B, only a composition of a sample film is required, an electron beam in relatively larger diameter may be used to improve the accuracy of analyzing the composition. Measurement time may be shortened because the beam is required to be irradiated at least one point on the specimen file. The condition of measurement of the composition distribution is so optimized accordingly that the spatial resolution and accuracy of measurement of the measurement are improved.

The above-mentioned other types of method for analyzing the composition may be carried out by mounting a device of analyzing the composition on a conventional TEM. It is therefore possible to perform both the other types of method and the present method in the same apparatus.

Then, the quantity of curvature of each lattice plane is estimated (step 9). The quantity of curvature of the lattice plane in which the equal thickness fringe 23 on the observation image coincides with the equal thickness fringe 23 on the simulation image is obtained by using bright-field and dark-field images.

First for simulation, the curvature of the lattice plane is simplified. In the real specimen, the angle of the lattice plane changes continuously (FIG. 17A). In the simulation using dynamic electron diffraction theory, it is however impossible to directly introduce the continuous tilting of the lattice plane. Therefore, the crystal is sliced in the direction of incidence of the electron beam so that calculation is made upon the assumption that the electron beam passes through respective slices successively. Although the more detailed strained structure can be analyzed as the number of slices increases, the increase of the number of slices is not practical because not only the number of variables for simulation increases but also the calculation time increases rapidly. Therefore, in this embodiment, calculation is made upon the assumption that two slices are provided and that lattice planes are tilted so as to be symmetric with respect to the horizontal line as shown in FIG. 17B. When the angle between the lattice plane at the upper portion of the crystal and the incident electron beam 11 is $\theta$ and the angle between the lattice plane at the lower portion of the crystal and the incident electron beam 11 is $-\theta$, the quantity of curvature of the lattice plane is expressed by $\theta$.

Next, a combination of plane indexes using for analyzing the strained structure is selected. A combination of indexes of planes perpendicular to each other, such as, for example, the (00n) lattice plane 24 and the (0n0) lattice plane 25, is desired. In this embodiment, strained structure is analyzed by $\theta_{00n}$ and $\theta_{0n0}$.

Strictly speaking, whether bright-field image or dark-field image, the equal thickness fringe 23 on the transmission image is affected by lattice planes of all plane indexes. Incidentally, in the case of a bright-field image, the influence of the angle change of the (0n0) lattice plane upon the bright-field image is equal to the influence of the angle change of the (00n) lattice plane upon the bright-field image. In the case of a dark-field image, the influence of the angle change of the lattice plane upon the dark-field image varies correspondingly to the plane index of the lattice plane. Assume now that the strained structure is represented by $(\theta_{0n0}, \theta_{00n})=(\theta_1, \theta_2)$. In this case, the same equal thickness fringe 23 is observed on the bright-field image if there is any strained structure selected from $(\theta_{0n0}, \theta_{00n})=(\pm\theta_1, \pm\theta_2)$, $(\pm\theta_2, \pm\theta_1)$. That is, in the case of a bright-field image, only the absolute value of the quantity of curvature of the lattice plane can be analyzed. On the other hand, in the case of a 0n0 dark-field image, the same equal thickness fringe 23 is observed in the condition of $(\theta_{0n0}, \theta_{00n})=(\theta_1, \pm\theta_2)$, and in the case of a 00n dark-field image, the same equal thickness fringe 23 is observed in the condition of $(\theta_{0n0}, \theta_{00n})=(\pm\theta_1, \theta_2)$. That is, the condition that the equal thickness fringes 23 on the 0n0 and 00n dark-field images coincide with each other is only $(\theta_{0n0}, \theta_{00n})=(\theta_1, \theta_2)$. That is, in the dark-field image, not only the quantity of curvature of the lattice plane but also the direction thereof can be determined.

The quantity of curvature of the lattice plane is analyzed on the basis of the above described consideration by the procedure shown in FIG. 18.

Respective steps are executed by the processor 9 of FIG. 1. The composition distribution is first obtained by a known method and inputted to the memory of the processor 9. Incidentally, if the composition distribution can be predicted from the process of production of the specimen, the predicted composition distribution can be used. In this embodiment, a model shown in FIG. 17B is selected as a lattice bending model (step 102). If there is any lattice plane having the angle change judged to be of a tilting type at step 3, the tilting angle of the lattice plane having the plane index is measured at step 4 so that the measurement result is used for simulation. Then, a desired combination of lattice plane indexes is selected (step 103). In steps 104 to 106, the equal thickness fringe on the bright-field image simulated while the angle distribution (absolute value) due to strain is changed successively is compared with the real equal thickness fringe measured in advance, so that the angle distribution is obtained in the case where the two coincide with each other. Each of the angles obtained here concerns the absolute value as described above. Accordingly, in steps 107 to 109, the direction of the angle obtained by using dark-field image is specified. That is, the equal thickness fringe on the dark-field image simulated while changing the angle distribution successively taking into account the direction is compared with the real equal thickness fringe measured in advance to thereby specify the angle distribution of the specimen. To improve the efficiency of execution of the steps 107 to 109, the angle distribution (absolute value) specified by the steps 104 to 106 is also used. Incidentally, the step 104 to 106 may be omitted.

The change of the intensity distribution of the equal thickness fringe varies correspondingly to the change factor, that is, in accordance with the fact that the change is a composition change or an angle change of the lattice plane. If dark-field and bright-field images having various plane indexes are used, the composition change and the angle change of the lattice plane can be specified by only simulation analysis though the number of variables for simulation increases.

Then, a 3-dimensional strained structure is constructed (step 10). Analysis results of the angle change of lattice planes of various plane indexes obtained in the steps 4 to 9 are used in combination to construct the 3-dimensional strained structure.

Figure 12:
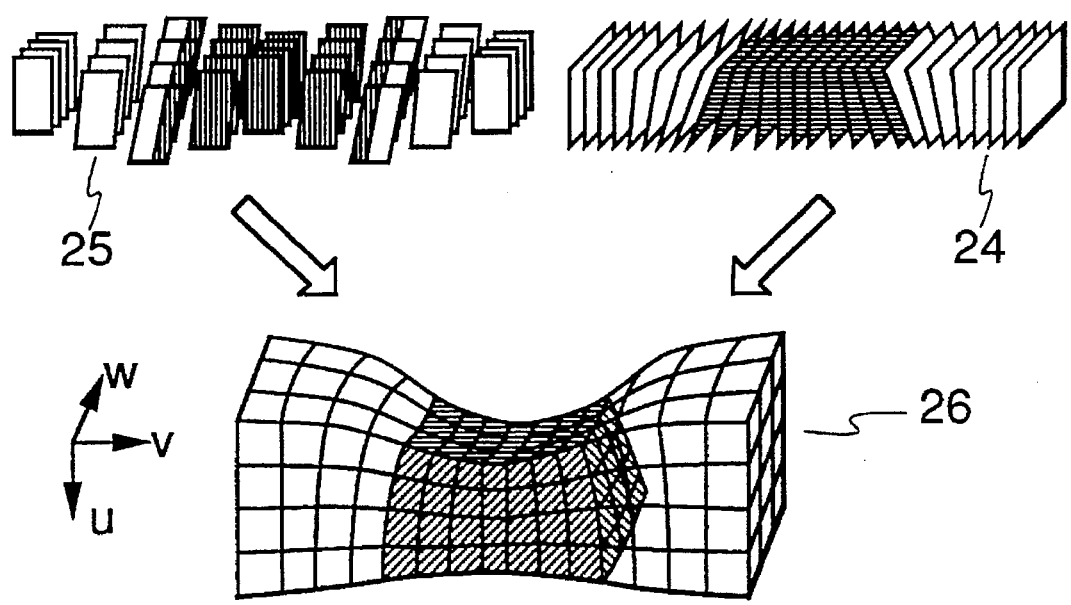
FIG. 12 is a diagram showing a 3-dimensional lattice model including a strained structure.

For example, the angle changes of the (00n) lattice planes 24 shown in FIG. 12 and the angle changes of the (0n0) lattice planes 25 perpendicular to the (00n) lattice planes 24 are analyzed. If it is measured that the (00n) lattice planes 24 are tilted so as to be symmetric with the vertical line and the (0n0) lattice planes 25 are tilted in the same direction as shown FIG. 12, a 3-dimensional strained structure 26 as shown in FIG. 12 can be constructed by integrating these measurement and analysis results. Furthermore, a more detailed 3-dimensional strained structure can be constructed by analyzing the lattice planes of various plane indexes.

According to the present embodiment, the composition distribution and strained structure can be analyzed with a spatial resolution (approximately 0.5 nm) of an electron microscope. Therefore, it is possible to display the cross-sectional structure of the specimen and results of analysis of composition distribution and strained structure simultaneously on the display screen 10 and evaluate them in association with the cross-sectional structure.

According to the present embodiment, the composition distribution and strained structure corresponding to the cross-sectional structure of a device can be quantitatively analyzed with a spatial resolution of approximately 0.5 nm, on the basis of the equal thickness fringe of a wedge-shaped specimen appearing on a transmission electron microscope.

By analysis using dark-field images of various plane indexes observed in various conditions in addition to bright-field images, it becomes possible to perform the analysis of a region having a mixture of composition change and lattice plane tilting or a region having lattice planes curved, which cannot be analyzed by the conventional technique. Furthermore, the structure of a specimen can be analyzed in more detail by the 3-dimensional strained structure analysis.

What is claimed is:

1. An electron microscope comprising:

an electron gun for emitting an electron beam;

a specimen holder for holding a wedge-shaped specimen;

an electron lens for radiating said electron beam onto said specimen;

an electron beam detector for detecting said electron beam from said specimen;

an objective aperture that passes a predetermined diffracted wave inserted in between said specimen holder and said electron beam detector;

an objective aperture moving means for moving a position of said objective aperture; and a signal processing means for processing a detection signal outputted from said electron beam detector;

wherein said electron beam detector outputs said detection signal correspondingly to the position of said objective aperture set by said objective aperture moving means.

2. An electron microscope according to claim 1, further comprising:

means for holding said detection signal; and means for comparing signals outputted respectively correspondingly to different positions of said objective aperture.

3. An electron microscope comprising:

an electron gun for emitting an electron beam;

a specimen holder for holding a wedge-shaped specimen;

an electron lens for radiating said electron beam onto said specimen;

an electron beam detector for detecting said electron beam from said specimen;

an objective aperture inserted in between said specimen holder and said electron beam detector;

an objective aperture moving means for moving a position of said objective aperture; and a signal processing means for processing a detection signal outputted from said electron beam detector;

wherein an output of said detection signal is changed according to positions of the objective aperture and wherein the objective aperture is moved by said moving means to positions corresponding to selection of predetermined Miller indicies of the electron beam passing through the specimen.

4. An electron microscope according to claim 3, further including means for controlling the outputting of said detection signal to output the detection signal at each of said positions.

5. An apparatus for observing lattice strain of a specimen, comprising:

a specimen holder for holding a wedge-shaped specimen;

means for radiating an electron beam onto a cleavage plane of said specimen so that said electron beam is transmitted through said specimen;

means for obtaining a bright-field image of said specimen, said bright-field image containing a first equal thickness fringe;

a first simulating means for simulating said first equal thickness fringe to appear on said bright-field image by referring to a given composition distribution while changing an assumed absolute value angle distribution of said specimen, and comparing the simulated first equal thickness fringe with a really observed first equal thickness fringe to thereby obtain an absolute value angle distribution when the simulated first equal thickness fringe and the really observed first equal thickness fringe substantially coincide with each other;

means for obtaining a dark-field image, said dark-field image containing a second equal thickness fringe;

a second simulating means for simulating said second equal thickness fringe to appear on said dark-field image on the basis of said obtained absolute value angle distribution by referring to said composition distribution while changing an assumed angle distribution of said specimen, and comparing the simulated second equal thickness fringe with a really observed second equal thickness fringe to thereby obtain an angle distribution when the simulated second equal thickness fringe and the really observed second equal thickness fringe substantially coincide with each other; and means for obtaining lattice strain from the obtained angle distribution.

6. A method of observing lattice strain of a specimen, comprising the steps of:

radiating an electron beam onto a cleavage plane of a wedge-shaped specimen and observing a first equal thickness fringe on a bright-field image of said specimen;

simulating said first equal thickness fringe to appear on said bright-field image by referring to a given composition distribution while changing an assumed absolute value angle distribution of said specimen;

comparing the observed first equal thickness fringe with the simulated first equal thickness fringe to thereby obtain and hold an absolute value angle distribution when the observed first equal thickness fringe and the simulated first equal thickness fringe substantially coincide with each other;

radiating said electron beam onto the cleavage plane of said wedge-shaped specimen and observing a second equal thickness fringe on a dark-field image of said specimen;

simulating said second equal thickness fringe to appear on said dark-field image in accordance by referring to said composition distribution while changing an assumed angle distribution of said specimen on the basis of said obtained absolute value angle distribution;

comparing the observed second equal thickness fringe with the simulated second equal thickness fringe to thereby obtain an angle distribution when the observed second equal thickness fringe and the simulated second equal thickness fringe substantially coincide with each other; and obtaining lattice strain of said specimen on the basis of the obtained angle distribution.

7. An apparatus for observing lattice strain of a specimen, comprising:

a specimen holder for holding a wedge-shaped specimen;

means for radiating an electron beam onto a cleavage plane of said specimen so that said electron beam is transmitted through said specimen;

means for obtaining a bright-field image of said specimen, said bright-field image containing a first equal thickness fringe;

a first simulating means for simulating said first equal thickness fringe to appear on said bright-field image by referring to a given composition distribution while changing an assumed absolute value angle distribution of said specimen regarding a curvature of a lattice plane in said specimen, and comparing the simulated first equal thickness fringe to obtain an absolute value angle distribution of said curvature of said lattice plane with a really observed first equal thickness fringe when the simulated first equal thickness fringe and the really observed first equal thickness fringe substantially coincide with each other;

means for obtaining a dark-field image, said dark-field image containing a second equal thickness fringe;

a second simulating means for simulating said second equal thickness fringe to appear on said dark-field image on the basis of said obtained absolute value angle distribution of said curvature of said lattice plane by referring to said composition distribution while changing an assumed angle distribution of said specimen, and comparing the simulated second equal thickness fringe with a really observed second equal thickness fringe to thereby obtain a direction of said curvature of the lattice plane at which the simulated second equal thickness fringe and the really observed second equal thickness fringe substantially coincide with each other; and means for obtaining lattice strain from the obtained direction of curvature.

8. A method of observing lattice strain of a specimen, comprising the steps of:

radiating an electron beam onto a cleavage plane of a wedge-shaped specimen and observing a first equal thickness fringe on a bright-field image of said specimen;

simulating said first equal thickness fringe to appear on said bright-field image by referring to a given composition distribution while changing an assumed absolute value angle distribution of said specimen regarding a curvature of a lattice plane in said specimen;

comparing the observed first equal thickness fringe with the simulated first equal thickness fringe to obtain an absolute value angle distribution of said curvature of said lattice plane when the observed first equal thickness fringe and the simulated first equal thickness fringe substantially coincide with each other;

radiating said electron beam onto the cleavage plane of said wedge-shaped specimen and observing a second equal thickness fringe on a dark-field image of said specimen;

simulating said second equal thickness fringe to appear on said dark-field image in accordance by referring to said composition distribution while changing an assumed angle distribution of said specimen on the basis of said obtained absolute value angle distribution of said curvature of said lattice plane;

comparing the observed second equal thickness fringe with the simulated second equal thickness fringe to thereby obtain a direction of the curvature of the lattice plane at which the observed second equal thickness fringe and the simulated second equal thickness fringe substantially coincide with each other; and obtaining lattice strain of said specimen on the basis of the obtained direction of curvature.

* * * * *